US012769212B2

(12) United States Patent
Miyashita et al.

(10) Patent No.: US 12,769,212 B2
(45) Date of Patent: Oct. 20, 2026

(54) EUV LIGHT GENERATION APPARATUS AND ELECTRONIC DEVICE MANUFACTURING METHOD

(71) Applicant: Gigaphoton Inc., Tochigi (JP)

(72) Inventors: Kotaro Miyashita, Oyama (JP); Chiharu Suzuki, Oyama (JP); Toru Abe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 86 days.

(21) Appl. No.: 18/904,718

(22) Filed: Oct. 2, 2024

(65) Prior Publication Data

US 2025/0164889 A1 May 22, 2025

(30) Foreign Application Priority Data

Nov. 17, 2023 (JP) ................................ 2023-196163

(51) Int. Cl.
*G03F 7/00* (2006.01)
*G03F 1/22* (2012.01)

(52) U.S. Cl.
CPC ............ *G03F 7/70033* (2013.01); *G03F 1/22* (2013.01); *G03F 7/70191* (2013.01); *G03F 7/702* (2013.01)

(58) Field of Classification Search
CPC .... G03F 7/70033; G03F 1/22; G03F 7/70191; G03F 7/702
See application file for complete search history.

(56) References Cited

U.S. PATENT DOCUMENTS

| | | | | |
|---|---|---|---|---|
| 9,241,395 | B2 * | 1/2016 | Senekerimyan | H05G 2/0084 |
| 9,778,022 | B1 | 10/2017 | Odle et al. | |
| 11,333,981 | B2 * | 5/2022 | Hosoda | H04N 23/56 |
| 12,204,250 | B2 * | 1/2025 | Su | G03F 7/70441 |
| 2019/0186892 | A1 | 6/2019 | Odle et al. | |
| 2019/0383598 | A1 | 12/2019 | Odle et al. | |
| 2020/0037429 | A1 | 1/2020 | Yabu | |
| 2020/0191554 | A1 | 6/2020 | Odle et al. | |

FOREIGN PATENT DOCUMENTS

WO 2018/052799 A1 3/2018

* cited by examiner

*Primary Examiner* — Hung V Nguyen
(74) *Attorney, Agent, or Firm* — Studebaker Brackett PLLC

(57) ABSTRACT

An EUV light generation apparatus according to an aspect of the present disclosure includes a chamber, a target supply device configured to supply a target into the chamber, a target imaging device configured to create a first target image by imaging a region including the target and a second target image by imaging the region at a timing at which a position of the target in the second target image does not overlap with a position thereof in the first target image, and a processor configured to create a background image using at least the second target image, creating a background corrected image by correcting the first target image, and detecting a position of the target based on the background corrected image.

18 Claims, 24 Drawing Sheets

FIG. 17

| | | | | |
|---|---|---|---|---|
| $\frac{1}{25}$ | $\frac{1}{25}$ | $\frac{1}{25}$ | $\frac{1}{25}$ | $\frac{1}{25}$ |
| $\frac{1}{25}$ | $\frac{1}{25}$ | $\frac{1}{25}$ | $\frac{1}{25}$ | $\frac{1}{25}$ |
| $\frac{1}{25}$ | $\frac{1}{25}$ | $\frac{1}{25}$ | $\frac{1}{25}$ | $\frac{1}{25}$ |
| $\frac{1}{25}$ | $\frac{1}{25}$ | $\frac{1}{25}$ | $\frac{1}{25}$ | $\frac{1}{25}$ |
| $\frac{1}{25}$ | $\frac{1}{25}$ | $\frac{1}{25}$ | $\frac{1}{25}$ | $\frac{1}{25}$ |

FIG. 18

| | | | | |
|---|---|---|---|---|
| $\frac{1}{256}$ | $\frac{4}{256}$ | $\frac{6}{256}$ | $\frac{4}{256}$ | $\frac{1}{256}$ |
| $\frac{4}{256}$ | $\frac{16}{256}$ | $\frac{24}{256}$ | $\frac{16}{256}$ | $\frac{4}{256}$ |
| $\frac{6}{256}$ | $\frac{24}{256}$ | $\frac{36}{256}$ | $\frac{24}{256}$ | $\frac{6}{256}$ |
| $\frac{4}{256}$ | $\frac{16}{256}$ | $\frac{24}{256}$ | $\frac{16}{256}$ | $\frac{4}{256}$ |
| $\frac{1}{256}$ | $\frac{4}{256}$ | $\frac{6}{256}$ | $\frac{4}{256}$ | $\frac{1}{256}$ |

EUV LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2023-196163, filed on Nov. 17, 2023, the entire contents of which are hereby incorporated by reference.

BACKGROUND

1. Technical Field

The present disclosure relates to an EUV light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

A system including a laser produced plasma (LPP) type EUV light generation apparatus using plasma generated by irradiating a target with laser light has been developed.

LIST OF DOCUMENTS

Patent Documents

Patent Document 1: US Patent Application Publication No. 2020/0037429

Patent Document 2: International Publication No. WO2018/052799

SUMMARY

An EUV light generation apparatus according to an aspect of the present disclosure includes a chamber, a target supply device configured to supply a target into the chamber, a target imaging device configured to create a first target image by imaging a region including the target and a second target image by imaging the region at a timing at which a position of the target in the second target image does not overlap with a position thereof in the first target image, and a processor configured to create a background image using at least the second target image, creating a background corrected image by correcting the first target image, and detecting a position of the target based on the background corrected image.

An electronic device manufacturing method according to an aspect of the present disclosure includes outputting EUV light generated by an EUV light generation apparatus to an exposure apparatus, and exposing a photosensitive substrate to the EUV light in the exposure apparatus to manufacture an electronic device. Here, the EUV light generation apparatus includes a chamber, a target supply device configured to supply a target into the chamber, a target imaging device configured to create a first target image by imaging a region including the target and a second target image by imaging the region at a timing at which a position of the target in the second target image does not overlap with a position thereof in the first target image, and a processor configured to create a background image using at least the second target image, creating a background corrected image by correcting the first target image, and detecting a position of the target based on the background corrected image.

An electronic device manufacturing method according to an aspect of the present disclosure includes inspecting a defect of a mask by irradiating the mask with EUV light generated by an EUV light generation apparatus, selecting a mask using a result of the inspection, and exposing and transferring a pattern formed on the selected mask onto a photosensitive substrate. Here, the EUV light generation apparatus includes a chamber, a target supply device configured to supply a target into the chamber, a target imaging device configured to create a first target image by imaging a region including the target and a second target image by imaging the region at a timing at which a position of the target in the second target image does not overlap with a position thereof in the first target image, and a processor configured to create a background image using at least the second target image, creating a background corrected image by correcting the first target image, and detecting a position of the target based on the background corrected image.

BRIEF DESCRIPTION OF THE DRAWINGS

Embodiments of the present disclosure will be described below merely as examples with reference to the accompanying drawings.

FIG. 17 is a diagram showing a 5×5 averaging filter.

FIG. 18 is a diagram showing a 5×5 Gaussian filter.

DESCRIPTION OF EMBODIMENTS

Contents

Figure 1:
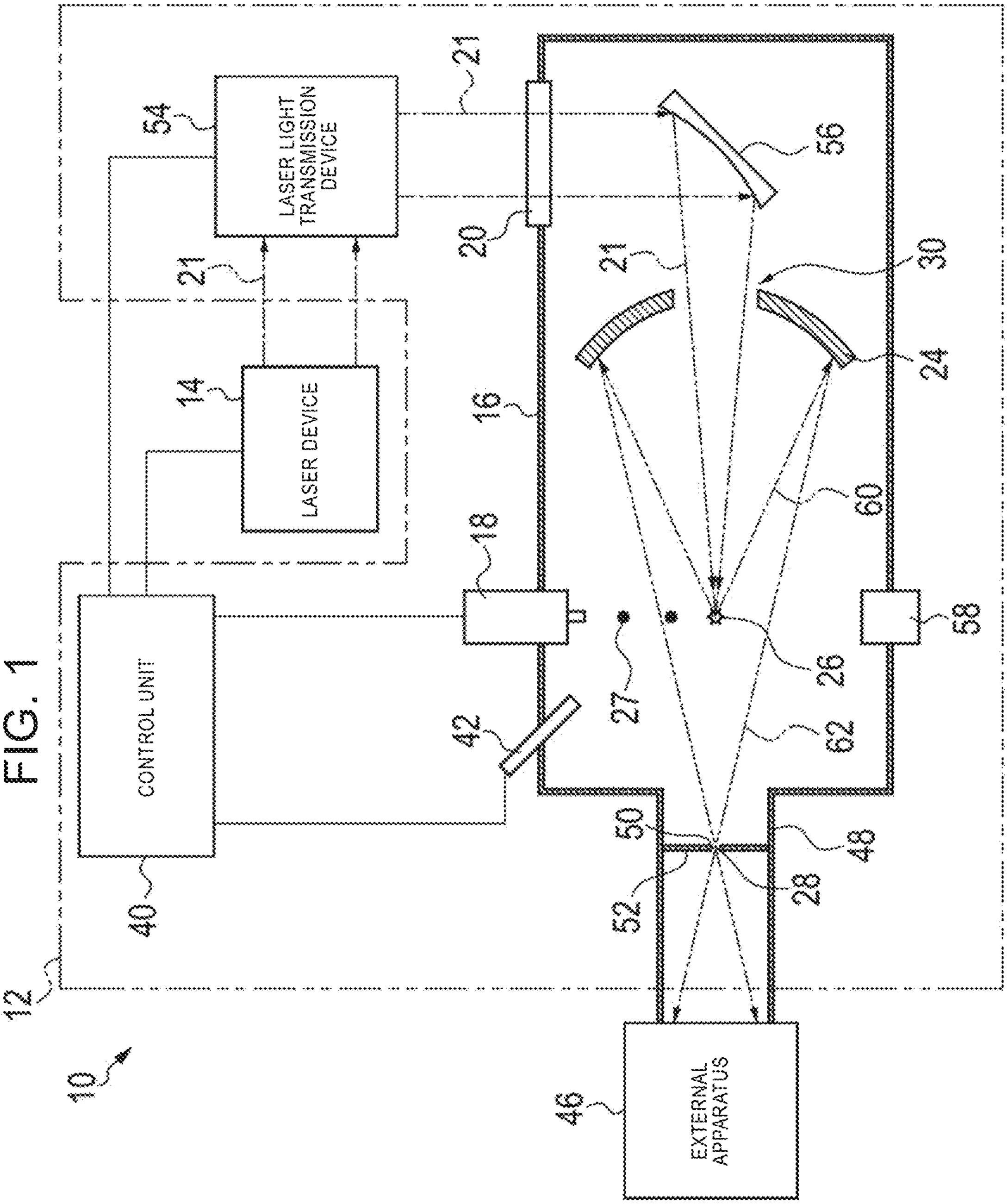
FIG. 1 is a view schematically showing an LPP EUV light generation system.

1. Overall description of EUV light generation system
   1.1 Configuration
   1.2 Operation
2. Comparative example
   2.1 Configuration
   2.2 Operation
   2.3 Problem
3. First Embodiment
   3.1 Configuration
   3.2 Operation
4. Second Embodiment
   4.1 Configuration
   4.2 Operation
   4.3 Effect
   4.4 First modification
   4.5 Second modification
   4.6 Third modification
5. Others Hereinafter, embodiments of the present disclosure will be described in detail with reference to the drawings. The embodiments described below shows some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Overall Description of EUV Light Generation System

1.1 Configuration

FIG. 1 schematically shows the configuration of an LPP EUV light generation system. An EUV light generation apparatus 12 is used together with a laser device 14. In the present disclosure, a system including the EUV light generation apparatus 12 and the laser device 14 is referred to as the EUV light generation system 10. The EUV light generation apparatus 12 includes a chamber 16 and a target supply device 18.

The chamber 16 is a sealable container. The target supply device 18 is configured to supply a droplet form target 27 into the chamber 16, and is mounted to penetrate, for example, a wall of the chamber 16. The material of the target 27 may include, but not limited to, tin, terbium, gadolinium, lithium, xenon, or a combination of any two or more thereof. Here, the droplet form refers to a state in which a molten target substance becomes substantially spherical due to surface tension thereof.

At least one through hole is formed in the wall of the chamber 16.

The through hole is blocked by a window 20 through which pulse laser light 21 output from the laser device 14 passes. For example, an EUV light concentrating mirror 24 having a spheroidal reflection surface is arranged in the chamber 16. The EUV light concentrating mirror 24 has a first focal point and a second focal point. A multilayer reflection film in which, for example, molybdenum and silicon are alternately stacked is formed on a surface of the EUV light concentrating mirror 24. The EUV light concentrating mirror 24 is arranged, for example, such that the first focal point is located in the plasma generation region 26 and the second focal point is located at an intermediate focal (IF) point 28. A through hole 30 is formed at the center of the EUV light concentrating mirror 24, and the pulse laser light 21 passes through the through hole 30.

The EUV light generation apparatus 12 includes a control unit 40, a target sensor 42, and the like. The target sensor 42 is configured to detect any one or more of the presence, position, trajectory, and velocity of the target 27. The target sensor 42 may have an imaging function.

Further, the EUV light generation apparatus 12 includes a connection portion 48 providing communication between the inside of the chamber 16 and the inside of an external apparatus 46. A wall 52 in which an aperture 50 is formed is arranged in the connection portion 48. The wall 52 is arranged such that the aperture 50 is located at the second focal point of the EUV light concentrating mirror 24. For example, the external apparatus 46 is an exposure apparatus.

Further, the EUV light generation apparatus 12 includes a laser light transmission device 54, a laser light concentrating mirror 56, a target collection unit 58, and the like. The laser light transmission device 54 includes an optical element for defining a transmission state of the laser light, and an actuator for adjusting the position, posture, and the like of the optical element. The target collection unit 58 is arranged on an extension line in a direction in which the target 27 output into the chamber 16 travels, and collects the target 27 that has not been irradiated with the pulse laser light 21.

The laser device 14 may be a master oscillator power amplifier (MOPA) system. The laser device 14 may include a master oscillator, an optical isolator, and a plurality of $CO_2$ laser amplifiers. A solid-state laser may be adopted as the master oscillator. The wavelength of the laser light output from the master oscillator is, for example, 10.59 μm, and the repetition frequency of the pulse oscillation is, for example, 100 KHz.

1.2 Operation

Operation of the EUV light generation system 10 will be described with reference to FIG. 1. The inside of the chamber 16 is held at a pressure lower than the atmospheric pressure, and is preferably a vacuum. Alternatively, a gas having a higher transmittance for EUV light is present inside the chamber 16. The gas present in the chamber 16 is, for example, a hydrogen gas.

The pulse laser light 21 output from the laser device 14 is transmitted through the window 20 via the laser light transmission device 54, and enters the chamber 16. The pulse laser light 21 travels along at least one laser light path in the chamber 16, is concentrated by being reflected by the laser light concentrating mirror 56, and is irradiated to the target 27.

The target supply device 18 outputs the target 27 toward the plasma generation region 26 in the chamber 16. The target 27 is irradiated with at least one pulse included in the pulse laser light 21. The target 27 irradiated with the pulse laser light 21 is turned into plasma, and radiation light 60 is radiated from the plasma. EUV light 62 included in the radiation light 60 is selectively reflected by the EUV light concentrating mirror 24. The EUV light 62 reflected by the EUV light concentrating mirror 24 is concentrated at the intermediate focal point 28 and output to the external apparatus 46. Here, one target 27 may be irradiated with a plurality of pulses included in the pulse laser light 21.

The control unit 40 is configured to control the entire EUV light generation system 10. The control unit 40 processes a detection result of the target sensor 42. Based on the detection result of the target sensor 42, the control unit 40 controls, for example, the timing at which the target 27 is output, the output direction, and the like of the target 27. Further, the control unit 40 controls, for example, the oscillation timing of the laser device 14, the travel direction of the pulse laser light 21, the light concentration position of the pulse laser light 21, and the like. The above-described various kinds of control are merely examples, and other control is added as necessary.

In the present disclosure, the control unit 40 can be realized by a combination of hardware and software of one or more computers. Software is synonymous with programs. The computer may include a processor such as a central processing unit (CPU), and a memory built in or connected to the processor. Here, some or all of the processing functions of the control unit 40 may be realized by using an integrated circuit such as an integrated circuit (IC), a field programmable gate array (FPGA), or an application specific integrated circuit (ASIC).

2. Comparative Example

2.1 Configuration

Figure 2:
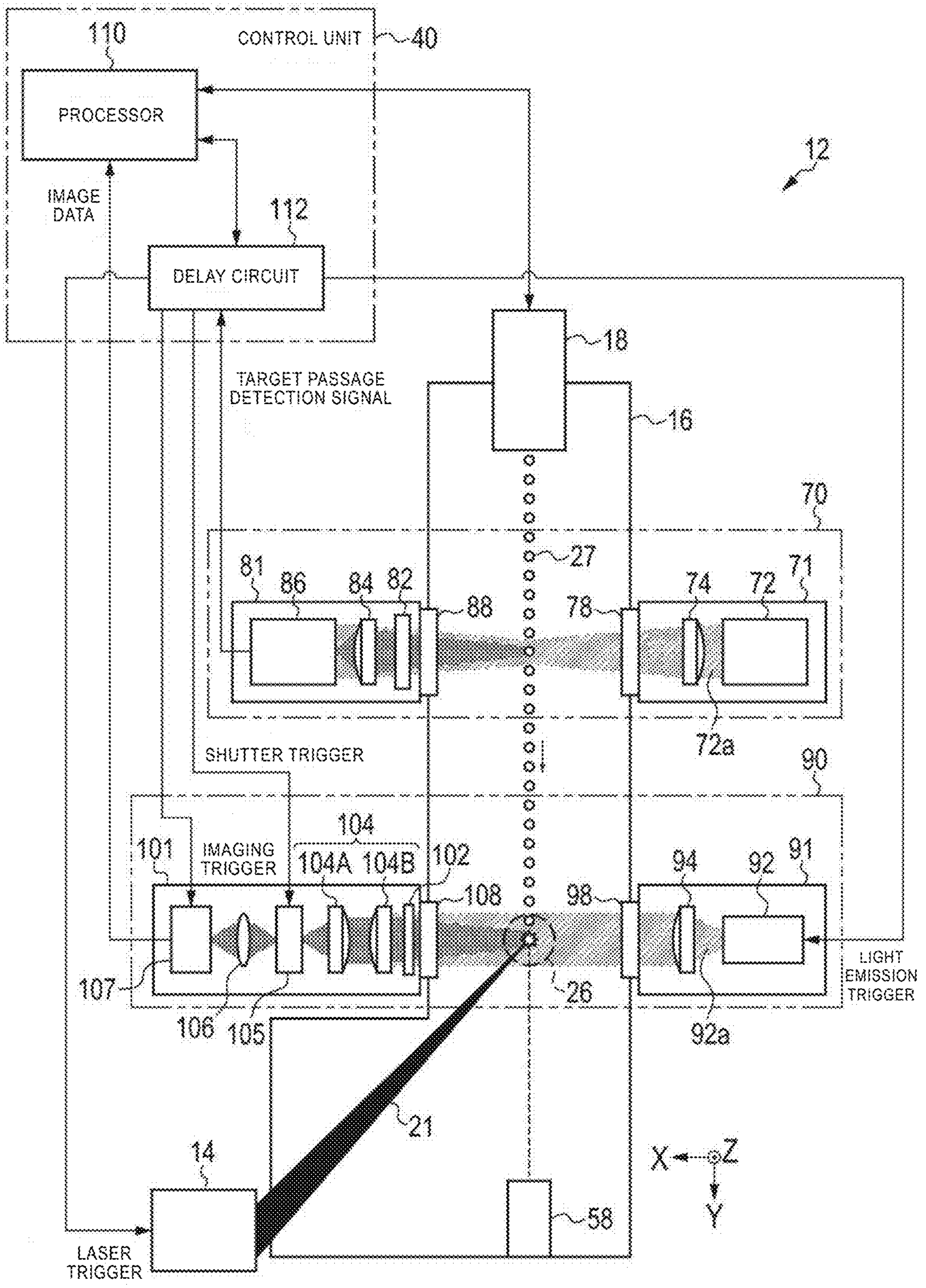
FIG. 2 is a view showing the configuration of an EUV light generation apparatus according to a comparative example.

FIG. 2 shows the configuration of the EUV light generation apparatus 12 according to a comparative example. The EUV light generation apparatus 12 includes a target passage detection device 70 and a target imaging device 90. The target passage detection device 70 and the target imaging device 90 are connected to the chamber 16, and correspond to the target sensor 42 described with reference to FIG. 1. Here, in FIG. 2, the laser light transmission device 54, the laser light concentrating mirror 56, the EUV light concentrating mirror 24, and the like shown in FIG. 1 are omitted.

Although not shown in detail, the target supply device 18 includes a tank for storing the target substance that is a material of the target 27, a nozzle for outputting the target 27, and a piezoelectric element arranged in the vicinity of the nozzle. Further, for example, a heater and a temperature sensor are arranged on the outer surface of the tank. The heater melts the target substance in the tank. The molten target substance is, for example, liquid tin.

The target supply device 18 is provided with a pressure adjuster for adjusting the pressure in the tank storing the target substance. The pressure adjuster adjusts the pressure in the tank, thereby causing the molten target substance to be ejected into the chamber 16 in a jet form. The piezoelectric element vibrates the nozzle to divide the target substance in a jet form at regular intervals to form a plurality of droplet form targets 27.

In FIG. 2, the vertical direction parallel to the trajectory of the target 27 is defined as a Y direction, one direction orthogonal to the Y direction is defined as an X direction, and a direction orthogonal to the Y direction and the X direction is defined as a Z direction. For example, the Z direction is a direction in which the EUV light 62 is output from the chamber 16 toward the external apparatus 46.

The target passage detection device 70 includes an illumination unit 71 and a detection unit 81. The illumination unit 71 includes an illumination light source 72 and an illumination optical system 74. The illumination light source 72 is a light source for outputting illumination light 72*a*. For example, the illumination light source 72 is a monochromatic laser light source. The illumination optical system 74 includes a light concentrating lens, and forms the illumination light 72*a* output from the illumination unit 71 into a predetermined size.

The illumination unit 71 is arranged outside the chamber 16 via a window 78. The window 78 is attached to the wall of the chamber 16. Specifically, the illumination unit 71 is arranged such that the trajectory of the target 27 introduced into the chamber 16 intersects the optical path of the illumination light 72*a* at a position between the target supply device 18 and the plasma generation region 26. Hereinafter, a region at which the trajectory of the target 27 intersects the optical path of the illumination light 72*a* is referred to as a "target detection region."

The detection unit 81 includes an optical filter 82, an imaging optical system 84, and an optical sensor 86. The optical filter 82 is a filter that transmits only light having a wavelength of the illumination light 72*a*. The imaging optical system 84 transfers an image of the target 27 illuminated by the illumination light 72*a* to a light receiving surface of the optical sensor 86. As the optical sensor 86, a photodiode, a photodiode array, an avalanche photodiode, a photomultiplier tube, a multi-pixel photon counter, an image intensifier, or the like can be used.

The detection unit 81 is arranged outside the chamber 16 via a window 88. The window 88 is attached to the wall of the chamber 16 as facing the window 78. The illumination unit 71 and the detection unit 81 are attached to the chamber 16 to face each other across the passage position of the target 27.

When the target 27 passes through the target detection region, the light intensity of the illumination light 72*a* received by the detection unit 81 decreases. A change in light intensity accompanied by the passage of the target 27 is detected by the optical sensor 86. The optical sensor 86 transmits a target passage detection signal indicating the passage timing of the target 27 to the control unit 40.

The target imaging device 90 includes an illumination unit 91 and an imaging unit 101. The illumination unit 91 includes an illumination light source 92 and an illumination optical system 94. For example, the illumination light source 92 is a flash lamp that outputs illumination light 92*a*. The illumination light source 92 performs light emission operation of outputting the illumination light 92*a* based on a light emission trigger transmitted from the control unit 40.

The illumination optical system 94 includes a collimating lens, and forms the illumination light 92*a* output from the illumination unit 91 into a predetermined size.

The illumination unit 91 is arranged outside the chamber 16 via a window 98. The window 98 is attached to the wall of the chamber 16. Specifically, the illumination unit 91 is arranged such that the trajectory of the target 27 introduced into the chamber 16 intersects the optical path of the illumination light 92*a* at the plasma generation region 26.

The imaging unit 101 includes an optical filter 102, an imaging optical system 104, a shutter 105, an imaging optical system 106, and an image sensor 107. The imaging optical system 104 includes a first lens 104A and a second lens 104B.

The optical filter 102 is a filter that transmits only light having a wavelength of the illumination light 92*a*. The imaging optical system 104 transfers an image of the target 27 illuminated by the illumination light 92*a* to the shutter 105. When the shutter 105 is in an open state, the imaging optical system 106 transfers the optical image output from the shutter 105 to an imaging surface of the image sensor 107.

As the shutter 105, for example, an image intensifier capable of performing gate operation can be used. A state in which the gate of the image intensifier is turned on corresponds to the open state of the shutter 105. A state in which the gate of the image intensifier is turned off corresponds to a close state of the shutter 105. The shutter 105 performs opening/closing operation based on a shutter trigger transmitted from the control unit 40.

As the image sensor 107, for example, a charge-coupled device (CCD) image sensor can be used. The image sensor 107 images an optical image transferred to the imaging surface to generate image data, and outputs the generated image data to the control unit 40. The image sensor 107 performs imaging operation based on an imaging trigger transmitted from the control unit 40. Hereinafter, the image data generated by the image sensor 107 is simply referred to as an "image." In particular, image data generated by imaging a region including at least one target 27 is referred to as a "target image."

The imaging unit 101 is arranged outside the chamber 16 via a window 108. The window 108 is attached to the wall of the chamber 16 as facing the window 98. The illumination unit 91 and the imaging unit 101 are attached to the chamber 16 to face each other across the passage position of the target 27. The direction in which the illumination unit 91 and the imaging unit 101 face each other is preferably a direction perpendicular to the Y direction, but may be a direction not perpendicular to the Y direction.

The imaging range of the trajectory of the target 27 by the imaging unit 101 is, for example, 2 mm. In order to detect the presence or position of the target 27 using the target image, it is sufficient that the target image includes images of one or more targets 27. Further, in order to detect the trajectory of the target 27 using the target image, it is sufficient that the target image includes images of two or more targets 27.

The control unit 40 includes a processor 110 and a delay circuit 112. A memory (not shown) is connected to or built in the processor 110, and the processor 110 controls the entire operation of the EUV light generation apparatus 12. Further, the processor 110 acquires the target image output from the image sensor 107, and performs processing for detecting the position of the target 27 and the like.

The target passage detection signal is a timing signal serving as a reference for timings of various trigger signals such as the light emission trigger, the shutter trigger, the imaging trigger, and a laser trigger. The delay circuit 112 generates the various trigger signals such as the light emission trigger, the shutter trigger, the imaging trigger, and the laser trigger by respectively giving predetermined delay times from the time of reception of the target passage detection signal.

The laser device 14 outputs the pulse laser light 21 based on the laser trigger transmitted from the control unit 40. The laser device 14 may include a prepulse laser device (not shown) and a main pulse laser device (not shown). In this case, the pulse laser light 21 includes prepulse laser light output from the prepulse laser device and main pulse laser light output from the main pulse laser device.

2.2 Operation

Figure 3:
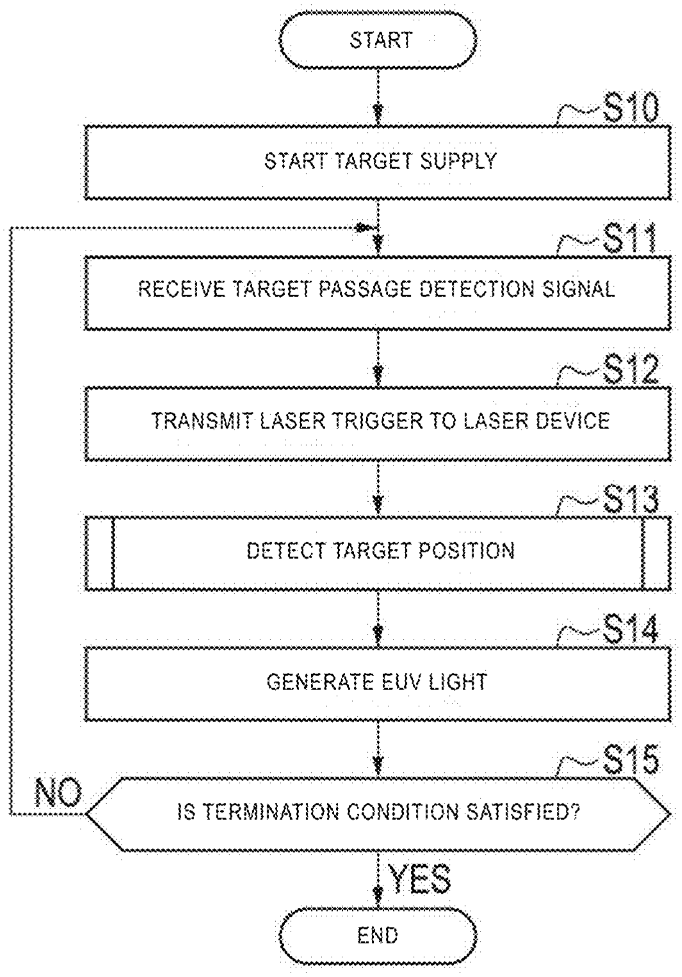
FIG. 3 is a flowchart showing the entire flow of the operation of the EUV light generation apparatus.

Next, the operation of the EUV light generation apparatus 12 according to the comparative example will be described. FIG. 3 shows the entire flow of the operation of the EUV light generation apparatus 12.

First, the processor 110 controls the target supply device 18 to start the supply of the target 27 into the chamber 16 (step S10). The target 27 supplied from the target supply device 18 into the chamber 16 passes through the plasma generation region 26 and is collected by the target collection unit 58. At this time, the target passage detection device 70 detects the passage of the target 27 through the target detection region, and transmits the target passage detection signal.

The delay circuit 112 receives the target passage detection signal transmitted from the target passage detection device 70 (step S11). At this time, the processor 110 transmits a delay time Δtl to the delay circuit 112.

The delay circuit 112 receives the delay time Δtl, generates the laser trigger rising at a timing delayed by the delay time Δtl from the time of reception of the target passage detection signal, and transmits the laser trigger to the laser device 14 (step S12).

Next, the processor 110 controls the target imaging device 90 to detect the position of the target 27 in the plasma generation region 26 based on the target image output from the target imaging device 90 (step S13).

Thereafter, the pulse laser light 21 output from the laser device 14 is radiated to the target 27 based on the laser trigger, whereby the EUV light 62 is generated (step S14). The target 27 is irradiated with the pulse laser light 21 at a timing at which the target 27 reaches a designated point in the plasma generation region 26.

The processor 110 determines whether or not a termination condition is satisfied (step S15). The termination condition is reception of an EUV light output stop command input from the external apparatus 46, for example. When the termination condition is not satisfied (step S15: NO), the processor 110 returns processing to step S11 and continues the control. When the termination condition is satisfied (step S15: YES), the processor 110 terminates the control.

Figure 4:
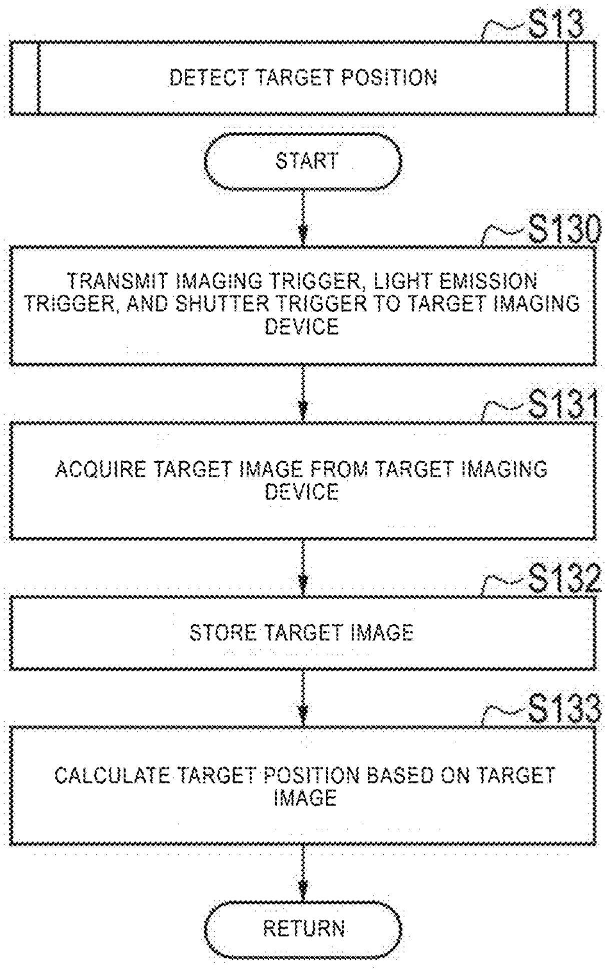
FIG. 4 is a flowchart showing details of a process of detecting a target position.

FIG. 4 shows details of the process of detecting the target position (step S13). As shown in FIG. 4, in step S13, the delay circuit 112 generates the imaging trigger, the light emission trigger, and the shutter trigger and transmits them to the target imaging device 90 (step S130). The imaging trigger is a signal rising at a timing delayed by a delay time Δti from the time of reception of the target passage detection signal. The light emission trigger is a signal rising at a timing delayed by a delay time Δtf from the time of reception of the target passage detection signal. The shutter trigger is a signal rising at a timing delayed by a delay time Δts from the time of reception of the target passage detection signal. The delay times Δti, Δtf, Δts are transmitted from the processor 110 to the delay circuit 112 together with the delay time Δtl in step S11 described above. The image sensor 107, the illumination unit 91, and the shutter 105 operate based on the imaging trigger, the light emission trigger, and the shutter trigger, so that the target image is created and output.

The processor 110 acquires the target image output from the target imaging device 90 (step S131), and stores the acquired target image (step S132). In the present disclosure, storing an image refers to storing image data in a memory.

Thereafter, the processor 110 calculates the position of the target 27 in the plasma generation region 26 based on the target image (step S133). Here, the processor 110 determines the delay times Δtl, Δti, Δtf, Δts so that the pulse laser light 21 is radiated to the target 27 at the designated point in the plasma generation region 26 based on the calculated position of the target 27. Specifically, the processor 110 calculates, taking into consideration the calculation result of the target position, the time from the output of the target detection signal until the target 27 reaches the designated point in the plasma generation region 26. Then, the processor 110 determines the delay times Δtl, Δti, Δtf, Δts by subtracting, from the calculated time, an internal delay time and a transmission time of each device that receives the corresponding trigger signal.

Figure 5:
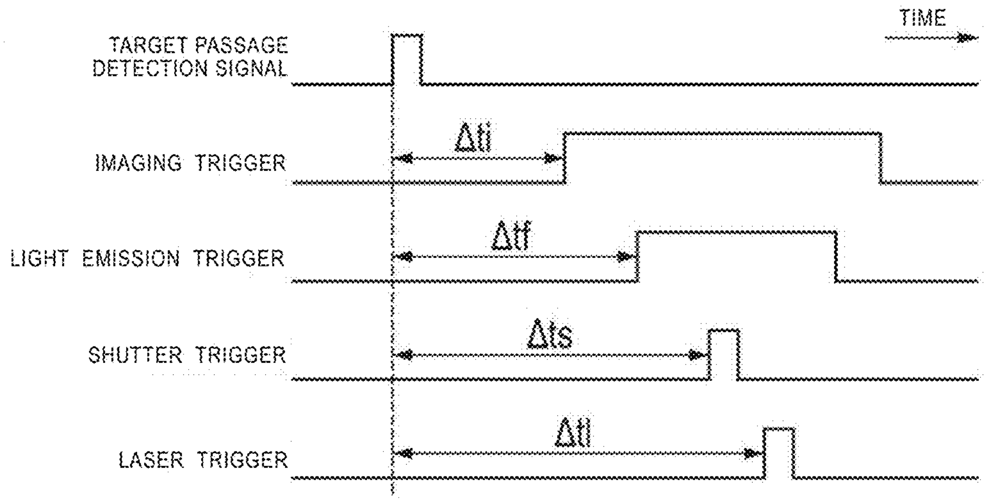
FIG. 5 is a diagram showing an example of a timing of each trigger signal.

FIG. 5 shows an example of the timings of the respective trigger signals. In the present disclosure, the trigger being turned on means that the level of the trigger signal is in a High state.

The image sensor 107 performs exposure in a period in which the imaging trigger is on. The illumination unit 91 outputs the illumination light 92*a* only while the light emission trigger is on during a period in which the imaging trigger is on. The shutter 105 is opened only while the shutter trigger is on during a period in which the light emission trigger is on. As a result, the target image is imaged by the image sensor 107.

The laser trigger is turned on after the shutter 105 is closed. As described above, since the timing of the period in which the shutter trigger is on and the timing of the period in which the laser trigger is on are shifted from each other, influence of plasma emission on the target image is eliminated.

2.3 Problem

Figure 6:
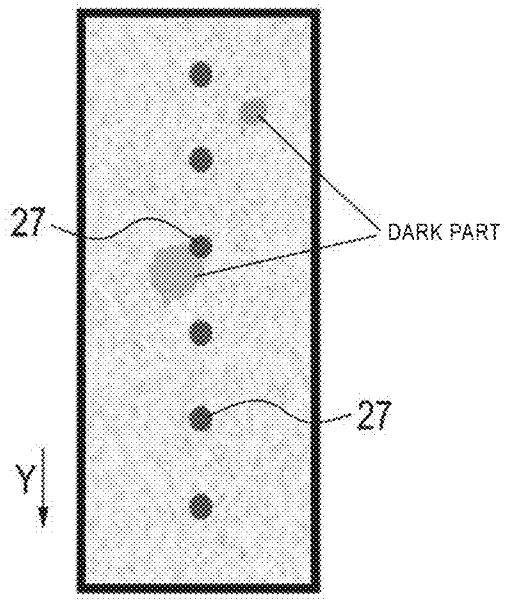
FIG. 6 shows an example of a target image created by a target imaging device.

FIG. 6 shows an example of the target image created by the target imaging device 90. As shown in FIG. 6, dark parts like shadows may appear in the target image. Such dark parts are caused by, for example, the following factors. The first factor is that a part of the illumination light 92*a* becomes dark due to deterioration of the illumination light source 92. The second factor is that the transmittance of a part of the illumination light 92*a* decreases due to deterioration of the illumination optical system 94, the imaging optical system 104, the shutter 105, the imaging optical system 106, and the like. The third factor is that the luminance of a part of the image data decreases due to deterioration of the image sensor 107.

When a dark part appears in the target image, the processor 110 may misdetect the dark part as the target 27. When such misdetection occurs, the pulse laser light 21 is radiated to a region at which the target 27 is not present, and generation of the EUV light 62 fails. Further, when a dark part and the target 27 overlap, the processor 110 may not be able to accurately detect the target 27. Even in such a case, the target 27 is not accurately irradiated with the pulse laser light 21, and generation of the EUV light 62 fails. It is desirable to be capable of accurately detecting the target 27 even when a dark part appears in the target image as described above.

3. First Embodiment

The EUV light generation apparatus 12 according to a first embodiment will be described. Duplicate description of the same configuration and operation as those of the comparative example will be omitted unless specific description is needed.

3.1 Configuration

The configuration of the EUV light generation apparatus 12 according to the present embodiment is similar to the configuration of the EUV light generation apparatus 12 according to the comparative example except that the processor 110 is configured to execute a process different from that in the comparative example.

3.2 Operation

Figure 7:
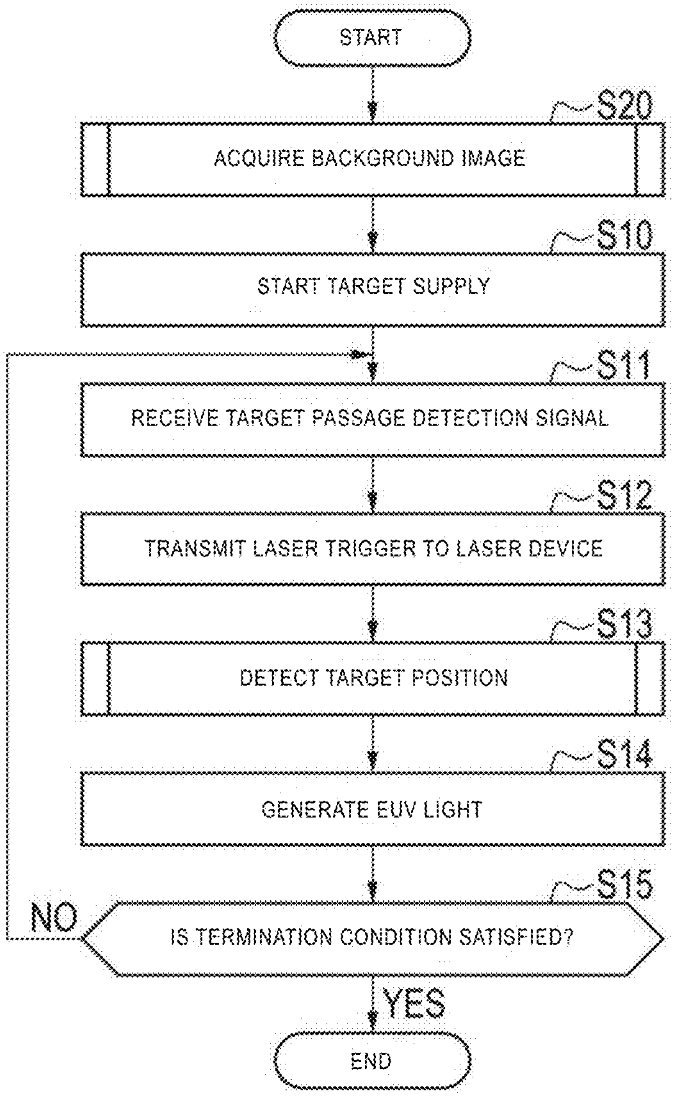
FIG. 7 is a flowchart showing the entire flow of the operation of the EUV light generation apparatus according to a first embodiment.

FIG. 7 shows the entire flow of the operation of the EUV light generation apparatus 12 according to the first embodiment. The operation of the EUV light generation apparatus 12 according to the present embodiment is different from that of the comparative embodiment only in that a process of acquiring a background image B0 (step S20) is added prior to step S10 and that the content of the process of detecting the target position (step S13) is different.

The processor 110 controls the target imaging device 90 to acquire the background image B0 output from the target imaging device 90 prior to causing the target supply device 18 to start supplying the target 27 into the chamber 16 (step S20). The background image B0 acquired in step S20 is an image created by the target imaging device 90 imaging an image of the plasma generation region 26 in a state in which the target 27 is not supplied into the chamber 16.

Figure 8:
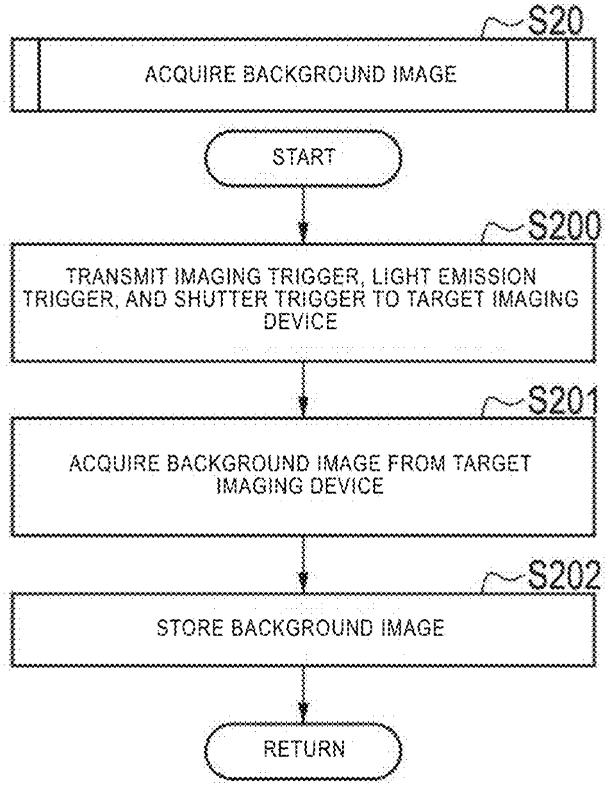
FIG. 8 is a flowchart showing details of a process of acquiring a background image.

FIG. 8 shows details of the process of acquiring the background image B0 (step S20). As shown in FIG. 8, in step S20, the delay circuit 112 generates the imaging trigger, the light emission trigger, and the shutter trigger and transmits them to the target imaging device 90 (step S200). Next, the processor 110 acquires the background image B0 output from the target imaging device 90 (step S201), and stores the acquired background image (step S202).

The imaging trigger, the light emission trigger, and the shutter trigger generated by the delay circuit 112 in step S20 are similar to the imaging trigger, the light emission trigger, and the shutter trigger for acquiring the target image described in the comparative example.

Figure 9:
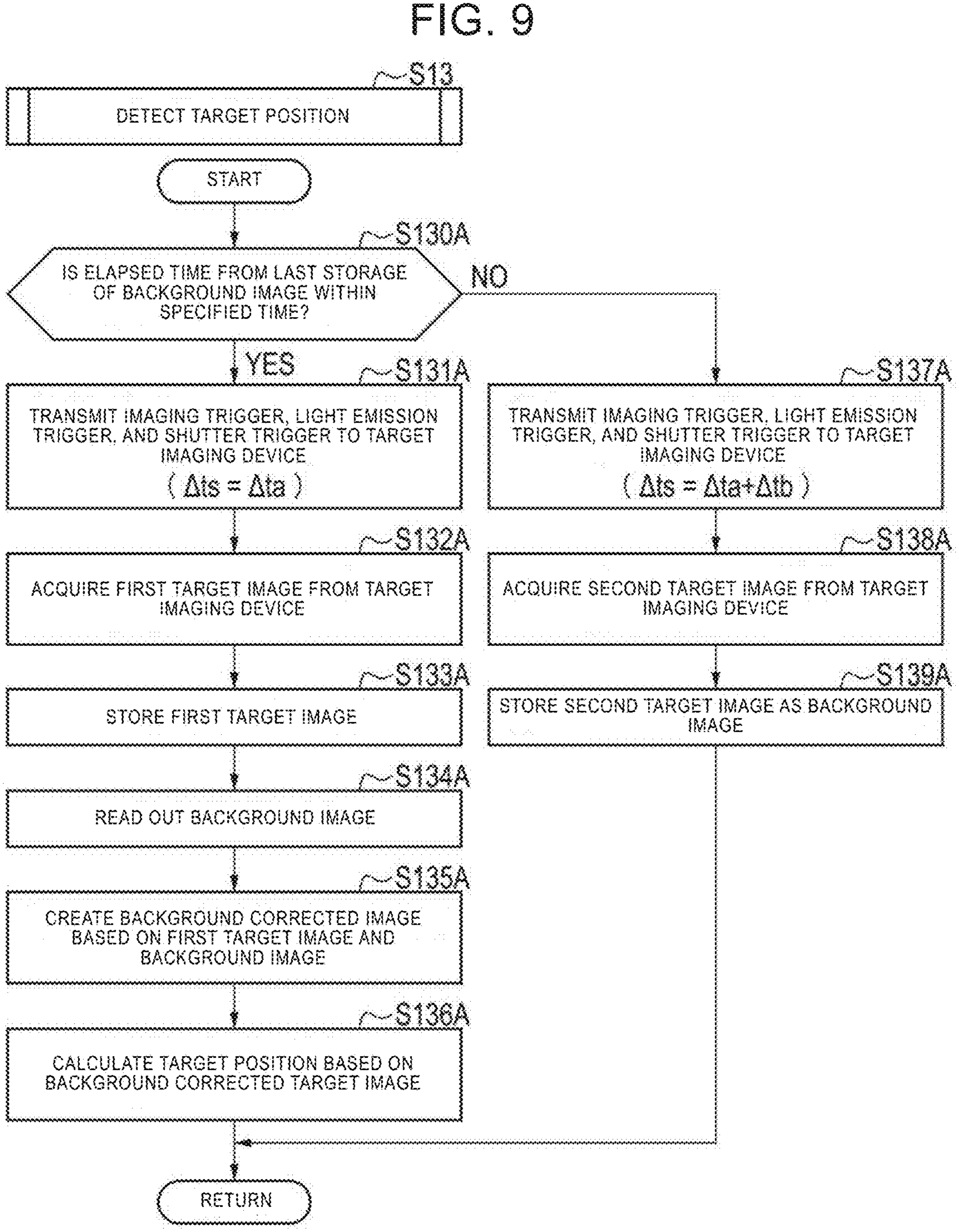
FIG. 9 is a flowchart showing details of the process of detecting the target position according to the first embodiment.

FIG. 9 shows details of the process of detecting the target position according to the first embodiment (step S13). As shown in FIG. 9, in step S13, the processor 110 determines whether or not the elapsed time from the last storage of the background image B0 is within a specified time (step S130A). For example, the specified time is in a range of 1 to 24 hours. When the elapsed time is within the specified time (step S130A: YES), the processor 110 advances processing to step S131A. When the elapsed time is not within the specified time (step S130A: NO), the processor 110 advances processing to step S137A. In step S130A for the first time after the target supply is started, the determination result is YES.

In step S131A, the delay circuit 112 generates the imaging trigger, the light emission trigger, and the shutter trigger and transmits them to the target imaging device 90. Here, the delay times Δti, Δtf, Δts for generating the imaging trigger, the light emission trigger, and the shutter trigger are transmitted from the processor 110 to the delay circuit 112. In step S131A, Δts=Δta is set. Here, Δta is the same delay time as the delay time Δts shown in FIG. 5. That is, the delay times Δti, Δtf, Δts are set to the same values as in the comparative example.

Next, the processor 110 acquires a first target image T1 output from the target imaging device 90 (step S132A), and stores the acquired first target image T1 (step S133A). The first target image T1 is an image similar to the target image of the comparative example.

Next, the processor 110 reads out the background image B0 (step S134A), and creates a background corrected image TIA based on the first target image T1 and the background image B0 (step S135A). In step S134A for the first time after the target supply is started in step S10, the processor 110 reads out the background image B0 stored in step S202. Specifically, the processor 110 creates the background corrected image TIA by taking a difference between the first target image T1 and the background image B0. For example, the processor 110 creates the background corrected image TIA by subtracting the background image B0 from the first target image T1. Since the above-described dark part is present in both of the first target image T1 and the background image B0, the background corrected image TIA is an image from which the dark part is removed.

Next, the processor 110 calculates the position of the target 27 in the plasma generation region 26 based on the background corrected image TIA (step S136A). Here, similarly to the comparative example, the processor 110 determines the delay times Δtl, Δti, Δtf, Δts so that the pulse laser light 21 is radiated to the target 27 at the designated point in the plasma generation region 26 based on the calculated position of the target 27.

In step S137A, the delay circuit 112 generates the imaging trigger, the light emission trigger, and the shutter trigger and transmits them to the target imaging device 90. Here, the delay times Δti, Δtf, Δts for generating the imaging trigger, the light emission trigger, and the shutter trigger are transmitted from the processor 110 to the delay circuit 112. In step S137A, Δts=Δta+Δtb is set. That is, in step S137A, an additional time Δtb is added to the delay time Δts set in step S131A. The additional time Δtb is determined so that the target 27 in the first target image T1 and the target 27 in the second target image T2, which will be described later, do not overlap with each other. For example, assuming that the output frequency of the target 27 output from the nozzle of the target supply device 18 is f, the additional time Δtb is 1/(2f).

Next, the processor 110 acquires a second target image T2 output from the target imaging device 90 (step S138A), and stores the acquired second target image T2 as the background image B0 (step S139A). That is, in the present embodiment, the background image B0 is created using the second target image T2. Assuming that the output frequency of the target 27 output from the nozzle of the target supply device 18 is f, the timing of acquiring the first target image T1 and the timing of acquiring the second target image T2 are shifted from each other by 1/(2f).

The elapsed time to be used for the determination in step S130A for the second or subsequent time after the target supply is started is the elapsed time from the time point at which the background image B0 is stored in step S139A. Further, in steps S134A, S135A for the second or subsequent time after the target supply is started, the processor 110 reads out the background image B0 stored in step S139A, and creates the background corrected image TIA using the read-out background image B0 and the first target image T1.

As described above, in the process of detecting the target position according to the present embodiment, the background image B0 is acquired and stored at every specified time during the generation operation of the EUV light 62.

Figure 10:
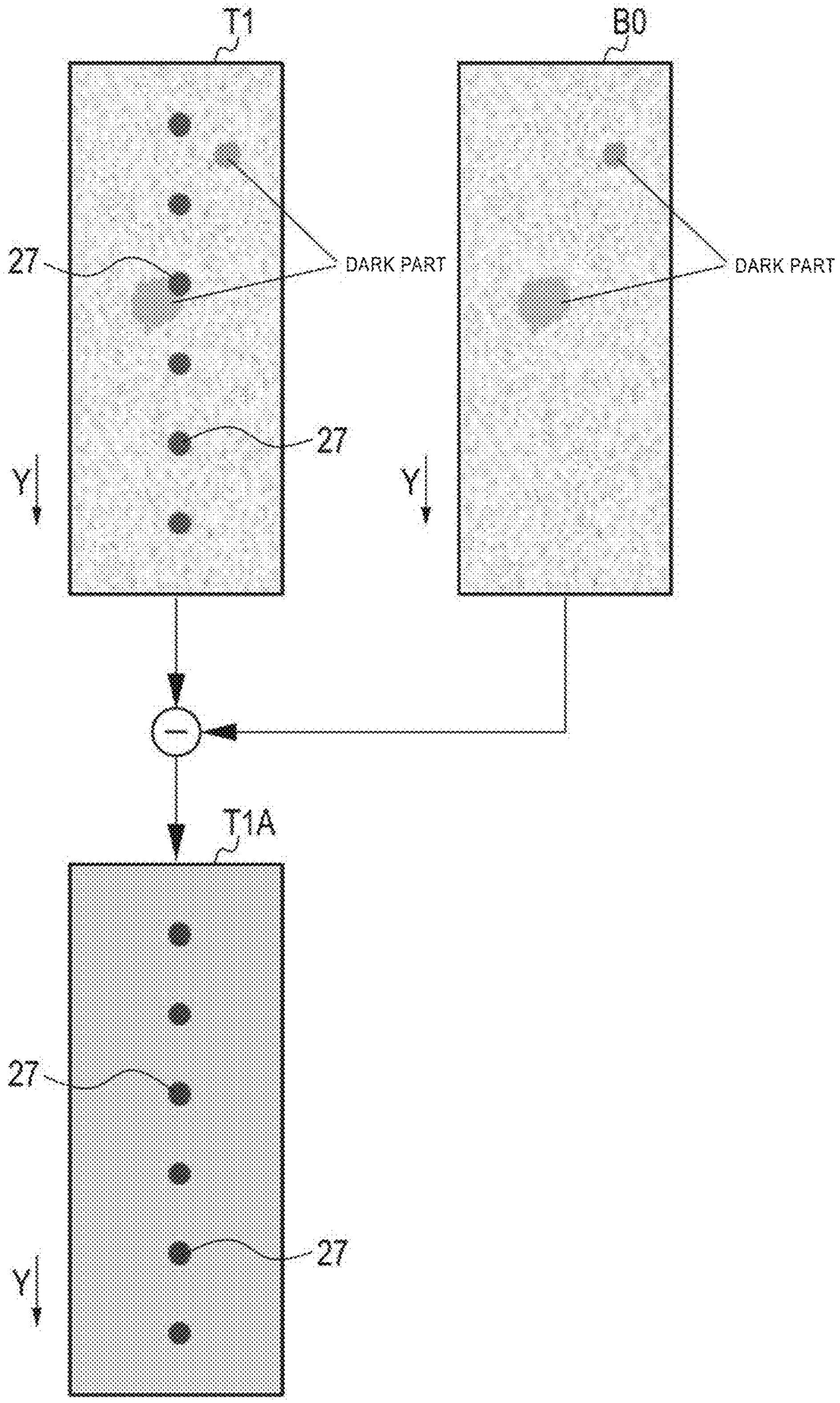
FIG. 10 is a diagram showing an example of a background corrected image creation process for the first time after target supply is started.

FIG. 10 shows an example of the background corrected image creation process for the first time after the target supply is started. In the background corrected image creation process for the first time, the background corrected image TIA is created by subtracting the background image B0 in which the target 27 is not present from the first target image T1. Accordingly, in the background corrected image TIA, the luminance of a region at which the target 27 is present is a negative value, and the luminance of a region at which the target 27 is not present is a value close to "0." In FIG. 10, a negative value is shown in black, and a value close to "0" is shown in gray. In the present disclosure, the presence of the target 27 in an image means the presence of an image of the target 27.

Figure 11:
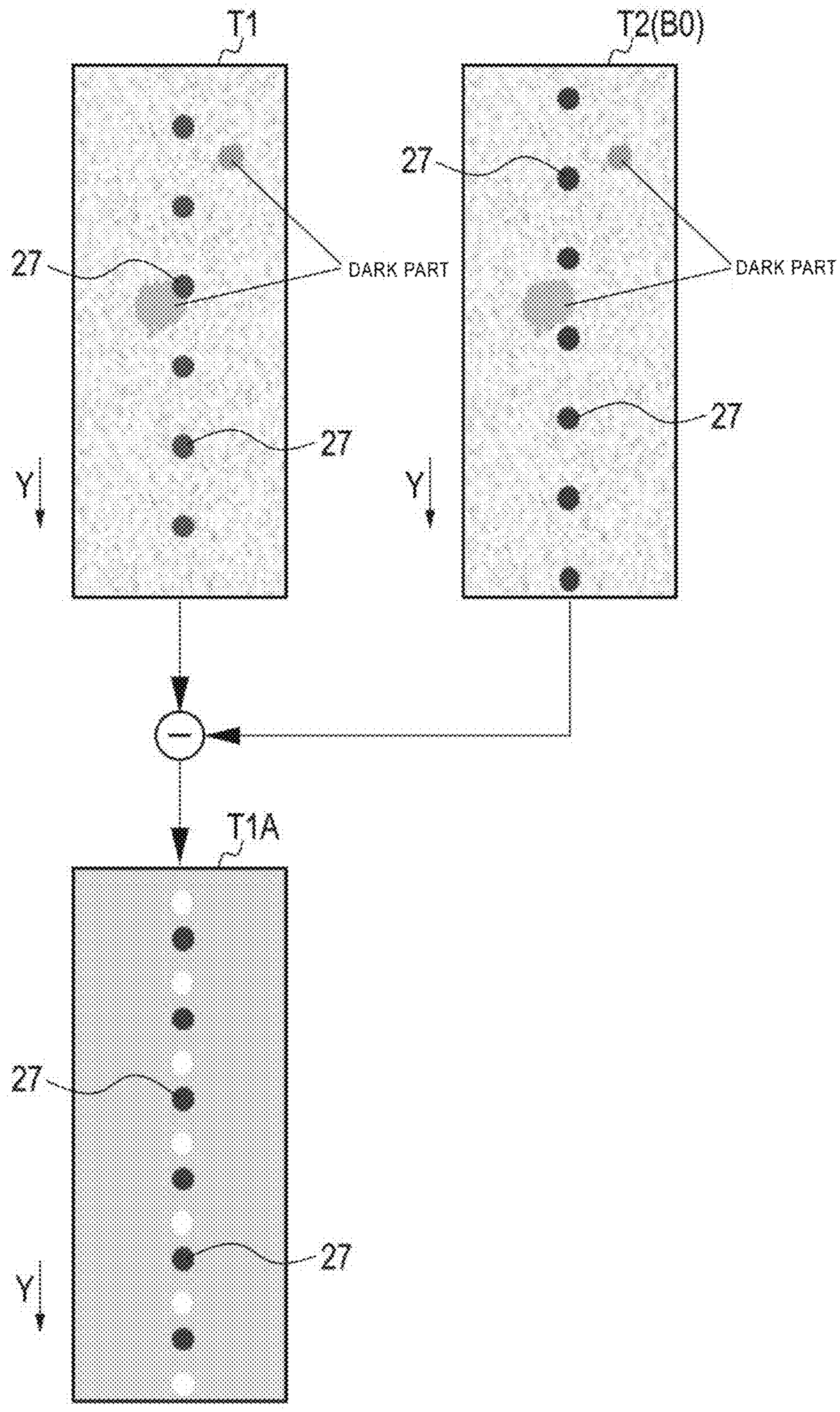
FIG. 11 is a diagram showing an example of the background corrected image creation process for the second or subsequent time after the target supply is started.

FIG. 11 shows an example of the background corrected image creation process for the second or subsequent time after the target supply is started. In the second or subsequent background corrected image creation process, the second target image T2 imaged at a timing at which the targets 27 do not overlap with the targets 27 in the first target image T1 is set as the background image B0, and the background corrected image TIA is created by subtracting the background image B0 from the first target image T1. Accordingly, in the background corrected image TIA, the luminance of a region at which the target 27 is present in the first target image T1 becomes a negative value, the luminance of a region at which the target 27 is present in the second target image T2 becomes a positive value, and the luminance of a region at which the target 27 is not present in the both becomes a value close to "0." In FIG. 11, a negative value is shown in black, a positive value is shown in white, and a value close to "0" is shown in gray.

As shown in FIGS. 10 and 11, the background corrected image TIA is an image in which a background light distribution, which is a luminance distribution of the background, is removed. In any case, the processor 110 can detect the position of the target 27 by detecting black regions from the background corrected image TIA.

3.3 Effect

As described above, in the present embodiment, the background corrected image TIA from which the background light distribution including a dark part is removed is created based on the first target image T1 and the background image B0, and the position of the target 27 is detected based on the background corrected image TIA. Accordingly, it is possible to accurately detect the position of the target 27 even when a dark part appears in the first target image T1.

Further, in the present embodiment, since the background image B0 is acquired at every specified time during the generation operation of the EUV light 62, it is also possible to cope with a change in the background light distribution due to deterioration during the operation of the EUV light generation apparatus 12.

Here, the target 27 may not be present in the second target image T2. For example, when only one target 27 is present in the first target image T1, the target 27 may not be present in the second target image T2 by shifting the timing of acquiring the first target image T1 and the timing of acquiring the second target image T2.

4. Second Embodiment

The EUV light generation apparatus 12 according to a second embodiment will be described. Duplicate description of the same configuration and operation as those of the comparative example will be omitted unless specific description is needed.

4.1 Configuration

The configuration of the EUV light generation apparatus 12 according to the present embodiment is similar to the configuration of the EUV light generation apparatus 12 according to the comparative example except that the processor 110 is configured to execute a process different from that in the comparative example.

4.2 Operation

The entire flow of the operation of the EUV light generation apparatus 12 according to the present embodiment is similar to that in the first embodiment. The operation of the EUV light generation apparatus 12 according to the present embodiment is different from that in the first embodiment only in the process of detecting the target position (step S13).

Figure 12:
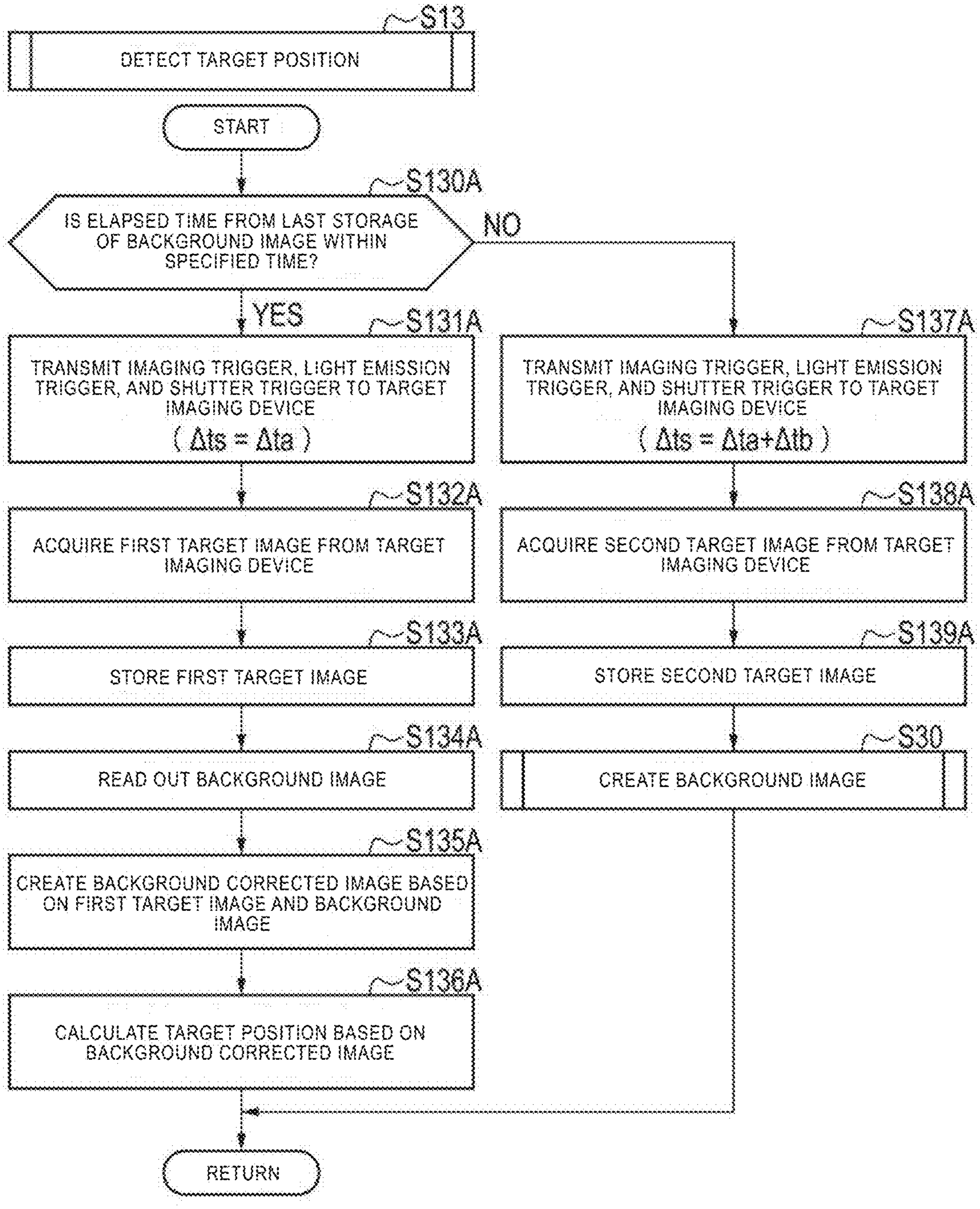
FIG. 12 is a flowchart showing details of the process of detecting the target position according to a second embodiment.

FIG. 12 shows details of the process of detecting the target position according to the second embodiment (step S13). The process of detecting the target position according to the present embodiment differs from that of the first embodiment only in that the process of creating the background image B0 (step S30) is executed after the second target image T2 is stored in step S139A.

Figure 13:
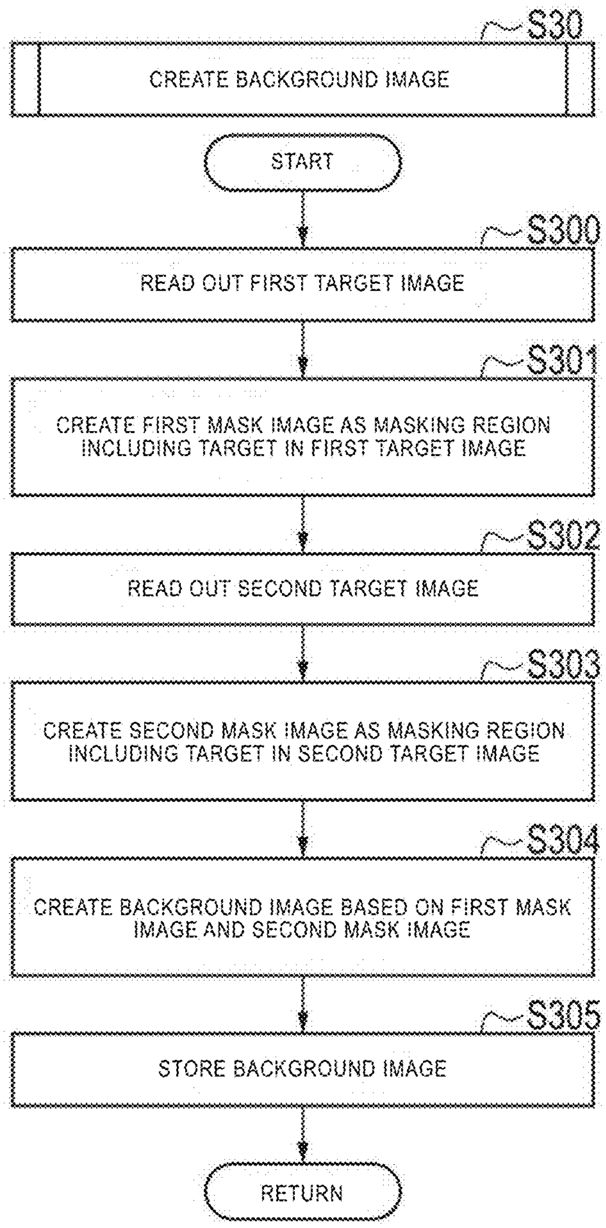
FIG. 13 is a flowchart showing details of a process of creating a background image.

FIG. 13 shows details of the process of creating the background image B0 (step S30). As shown in FIG. 13, in step S30, the processor 110 reads out the first target image T1 stored in step S133A (step S300), and creates a first mask image M1 in which a region including the target 27 in the first target image T1 is masked (step S301). Further, the processor 110 reads out the second target image T2 stored in step S139A (step S302), and creates a second mask image M2 in which a region including the target 27 in the second target image T2 is masked (step S303). In the present disclosure, masking refers to setting a region that is not used for creating the background image B0.

Next, the processor 110 creates the background image B0 based on the first mask image M1 and the second mask image M2 (step S304), and stores the created background image B0 (step S305).

Figure 14:
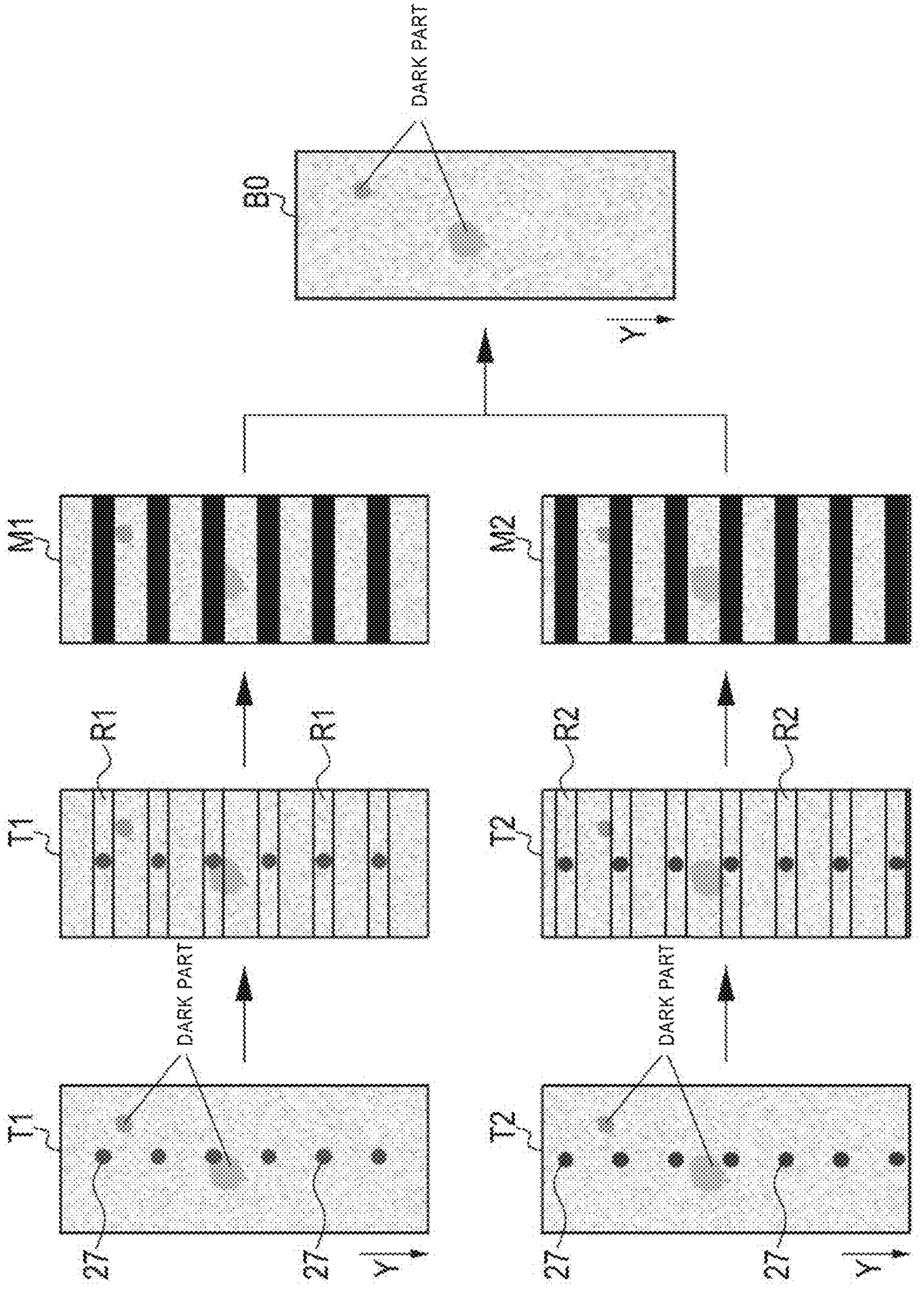
FIG. 14 is a diagram showing an example of the process of creating the background image.

FIG. 14 shows an example of the process of creating the background image B0. As shown in FIG. 14, the processor 110 specifies first regions R1 including the targets 27 from the first target image T1, and creates the first mask image M1 in which the specified first regions R1 are masked. Further, the processor 110 specifies second regions R2 including the targets 27 from the second target image T2, and creates the second mask image M2 in which the specified second regions R2 are masked. The first regions R1 and the second regions R2 are rectangular regions having substantially the same length as the target 27 in the Y direction. Each of the shapes of the first regions R1 and the second regions R2 may be a circle with the target 27 as the center.

The processor 110 creates the background image B0 by combining the first mask image M1 and the second mask image M2. For example, the processor 110 creates the background image B0 by extracting an image of regions, from the first mask image M1, corresponding to mask regions of the second mask image M2 and joining the extracted image with reference to the second mask image M2. As described above, the background image B0 created in step S304 is an image in which the target 27 is not present, similarly to the background image B0 acquired in step S20.

In the present embodiment, the background corrected image creation process for the second or subsequent time after the target supply is started is similar to the process shown in FIG. 10, and the background corrected image TIA is an image in which the background light distribution, which is the luminance distribution of the background, is removed.

4.3 Effect

In the present embodiment, similarly to the first embodiment, the position of the target 27 can be accurately detected even when a dark part appears in the first target image T1. Further, since the background image B0 created after the target supply is started is an image in which the target 27 is not present, the background image B0 need not be re-created even when the position of the target 27 in the Y direction changes in the first target image T1.

4.4 First Modification

Next, a first modification of the second embodiment will be described. The present modification is different from the second embodiment only in that the process of correcting the luminance of the first target image T1 and the second target image T2 is added in the process of creating the background image B0.

Figure 15:
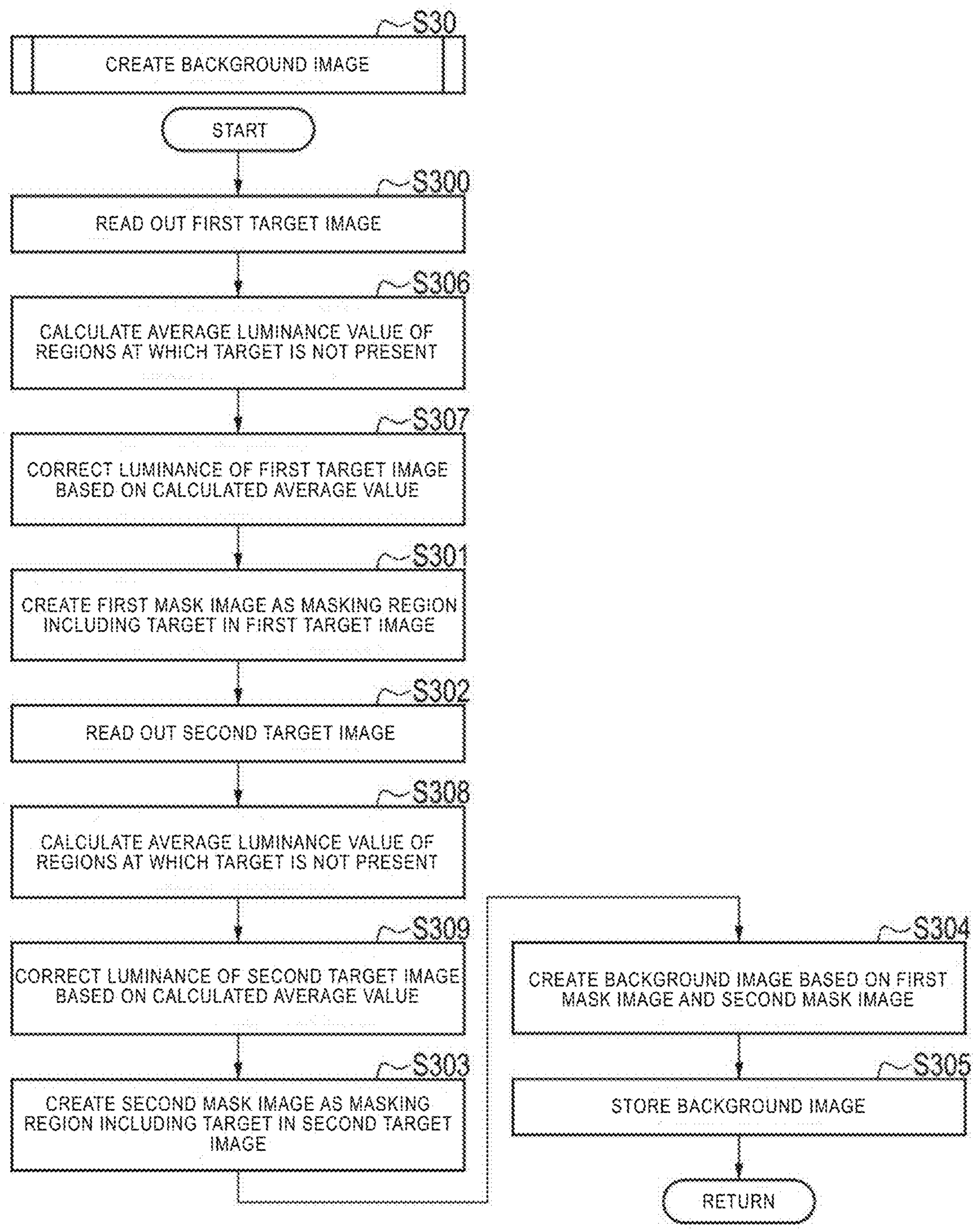
FIG. 15 is a flowchart showing details of the process of creating the background image according to a first modification.

FIG. 15 shows details of the process of creating the background image B0 according to the first modification (step S30). In the present modification, steps S306, S307 are added between step S300 and step S301, and steps S308, S309 are added between step S302 and step S303.

In the present modification, the processor 110 reads out the first target image T1 in step S300, and then calculates the average luminance value of regions at each of which the target 27 is not present in the first target image T1 (step S306). Here, the regions at each of which the target 27 is not present are, for example, regions other than the first regions R1 shown in FIG. 14. Then, the processor 110 corrects the luminance value of each pixel of the first target image T1 based on the calculated average luminance value (step S307). For example, assuming that the average luminance value calculated in step S306 is L1, the processor 110 multiplies the luminance value of each pixel of the first target image T1 by C/L1 as a correction value. Here, C is a constant, for example, 100.

Further, the processor 110 reads out the second target image T2 in step S302, and then calculates the average luminance value of regions at each of which the target 27 is not present in the second target image T2 (step S308). Here, the regions at each of which the target 27 is not present are, for example, regions other than the second regions R2 shown in FIG. 14. Then, the processor 110 corrects the luminance value of each pixel of the second target image T2 based on the calculated average luminance value (step S309). For example, assuming that the average luminance value calculated in step S306 is L2, the processor 110 multiplies the luminance value of each pixel of the second target image T2 by C/L2 as a correction value.

In the present modification, the first target image T1 and the second target image T2 are corrected so that the average luminance values of the both coincide with each other. Therefore, even when there is a difference in the average luminance values between the first target image T1 and the second target image T2 due to the difference in the timings of acquiring the both, the difference in luminance at a joining area between the first mask image M2 and the second mask image is reduced. Accordingly, the quality of the background image B0 created in step S304 is improved.

In the present modification, the luminance of the first target image T1 and the luminance of the second target image T2 are both corrected, but only the luminance of one of the first target image T1 and the second target image T2 may be corrected. For example, the luminance value of each pixel of the first target image T1 may be corrected by multiplying L2/L1 as a correction value, and the second target image T2 may not be corrected.

4.5 Second Modification

Next, a second modification of the second embodiment will be described. The present modification is different from the second embodiment only in that the background corrected image TIA is subjected to a blurring process in the process of detecting the target position.

Figure 16:
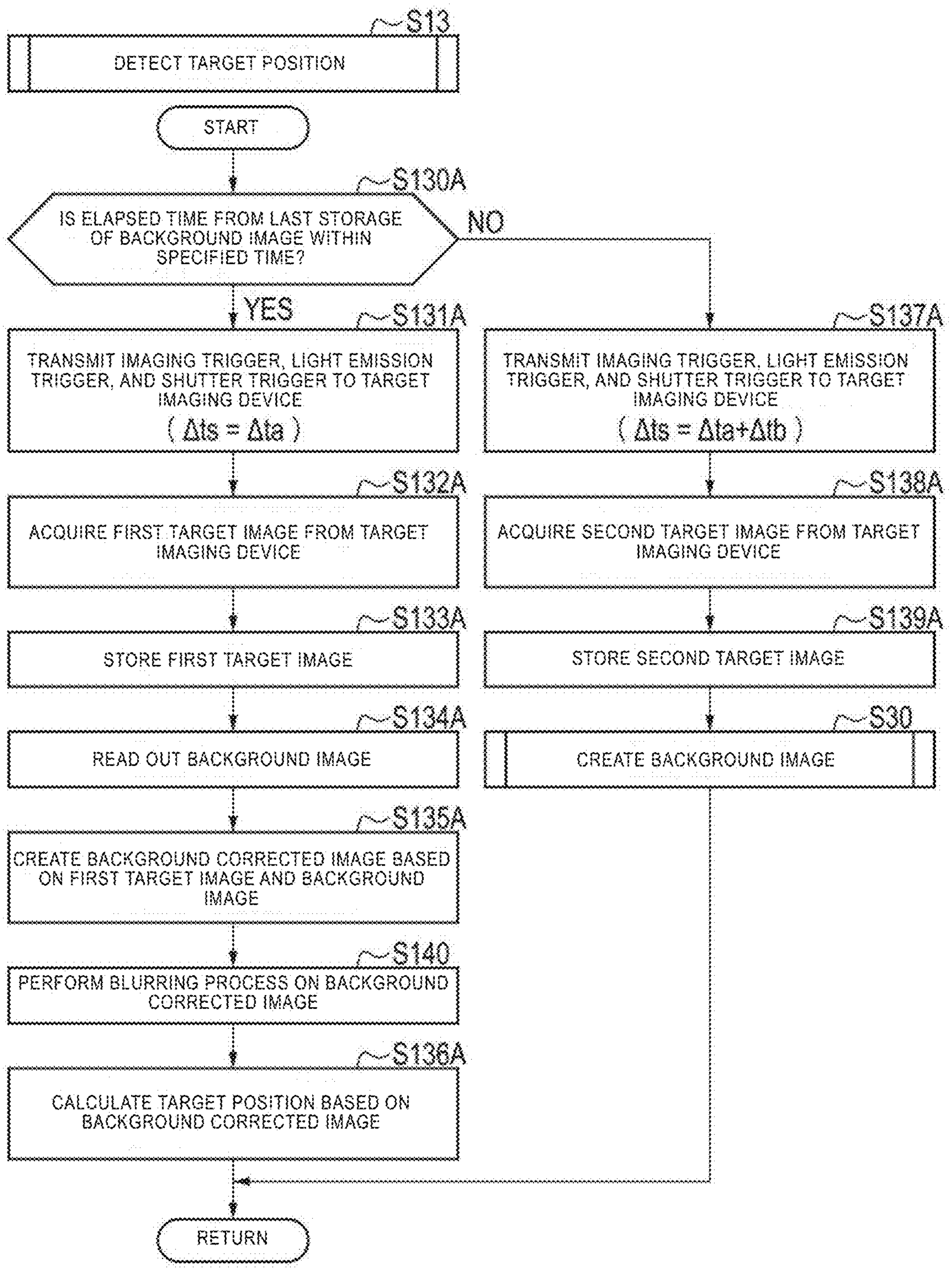
FIG. 16 is a flowchart showing details of the process of detecting the target position according to a second modification.

FIG. 16 shows details of the process of detecting the target position according to the second modification (step S13). In the present modification, step S140 is added after step S135A.

In the present modification, the processor 110 creates the background corrected image TIA in step S135A, and then performs the blurring process on the background corrected image TIA (step S140). Thereafter, the processor 110 calculates the position of the target 27 based on a blurred background corrected image T1B (step S136A).

The blurring process is a filtering process using a smoothing filter such as an averaging filter or a Gaussian filter. The filtering process is a process of setting the smoothing filter around a focused pixel while setting each pixel in an image as the focused pixel, and replacing the pixel value of the focused pixel with a value obtained by performing weighted addition of a plurality of pixel values in the smoothing filter using a weight coefficient defined in the smoothing filter.

FIG. 17 shows a 5×5 averaging filter. FIG. 18 shows a 5×5 Gaussian filter. The numerical values shown in FIGS. 17 and 18 are weighting coefficients. In the filtering process using the averaging filter, weighting is uniformly performed on a plurality of pixels in the averaging filter. In the filtering process using the Gaussian filter, the plurality of pixels in the averaging filter are weighted according to a distance from a focused pixel based on the following expression (1). Here, "x,y" is a coordinate of a pixel with the focused pixel being as the origin. Further, σ is a standard deviation representing the degree of smoothing.

[Expression 1]

$$f(x, y) = \frac{1}{2\pi\sigma^2}\exp\left(-\frac{x^2+y^2}{2\sigma^2}\right) \quad (1)$$

Figure 19:
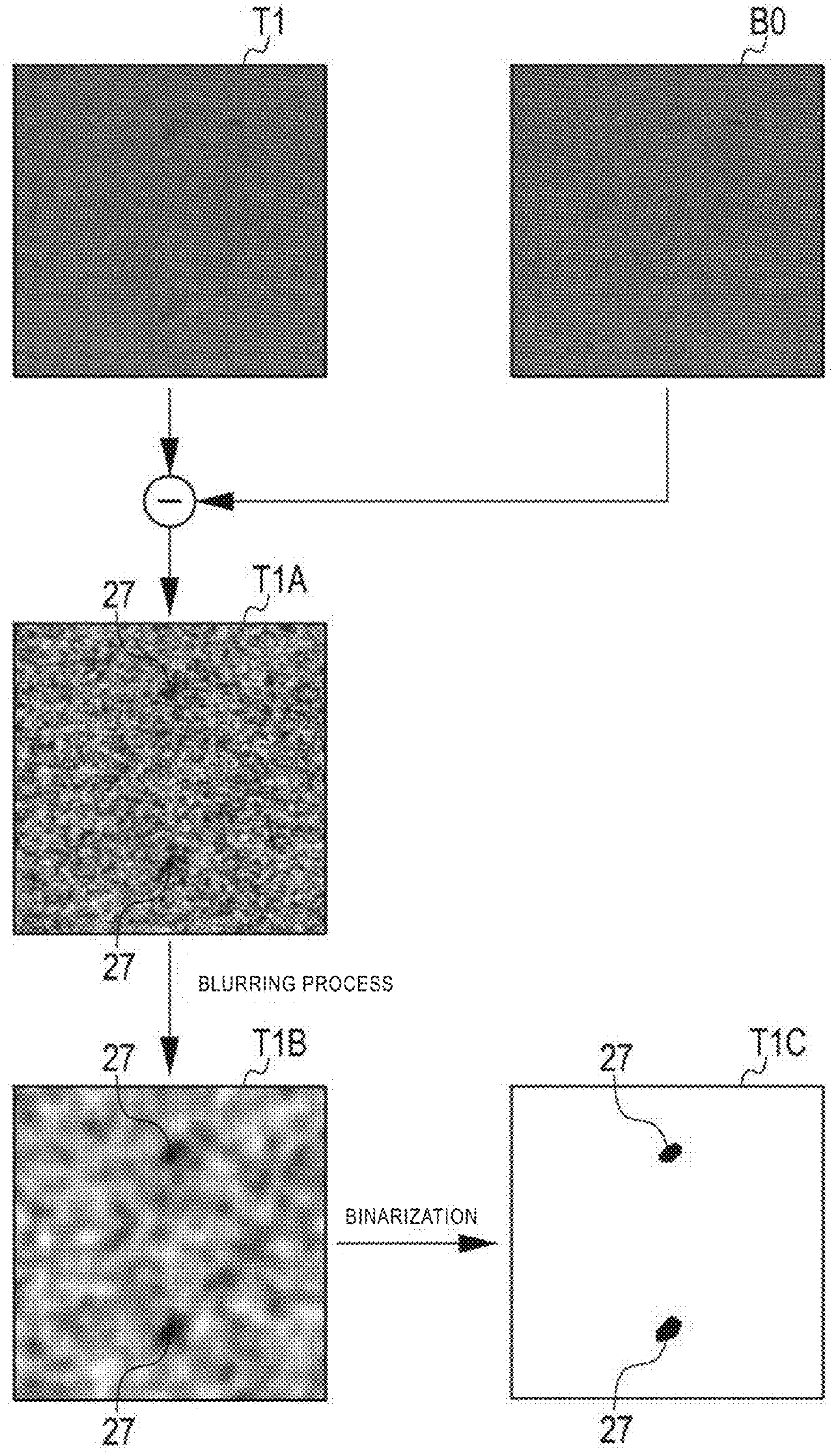
FIG. 19 is a diagram showing an example of a blurring process.

FIG. 19 shows an example of the blurring process. As shown in FIG. 19, in the background corrected image TIA created based on the first target image T1 and the background image B0, the images of the targets 27 are unclear, and the positions of the targets 27 may not be easily detected. However, by performing the blurring process on the background corrected image TIA, the images of the targets 27 become clear, and the positions of the targets 27 may be easily detected.

Further, as shown in FIG. 19, the positions of the targets 27 may be detected based on a binarized image TIC created by performing a binarization process on the blurred background corrected image T1B. Accordingly, the positions of the targets 27 may be detected more easily.

Here, the blurring process according to the present modification may be performed on the background corrected image TIA created in the first embodiment. Accordingly, the images of the targets 27 become clear, and the positions of the targets 27 may be easily detected.

4.6 Third Modification

Next, a third modification of the second embodiment will be described. The present modification is different from the second embodiment only in that a plurality of the first target images T1 and a plurality of the second target images T2 are acquired to create the background image B0.

Figure 20:
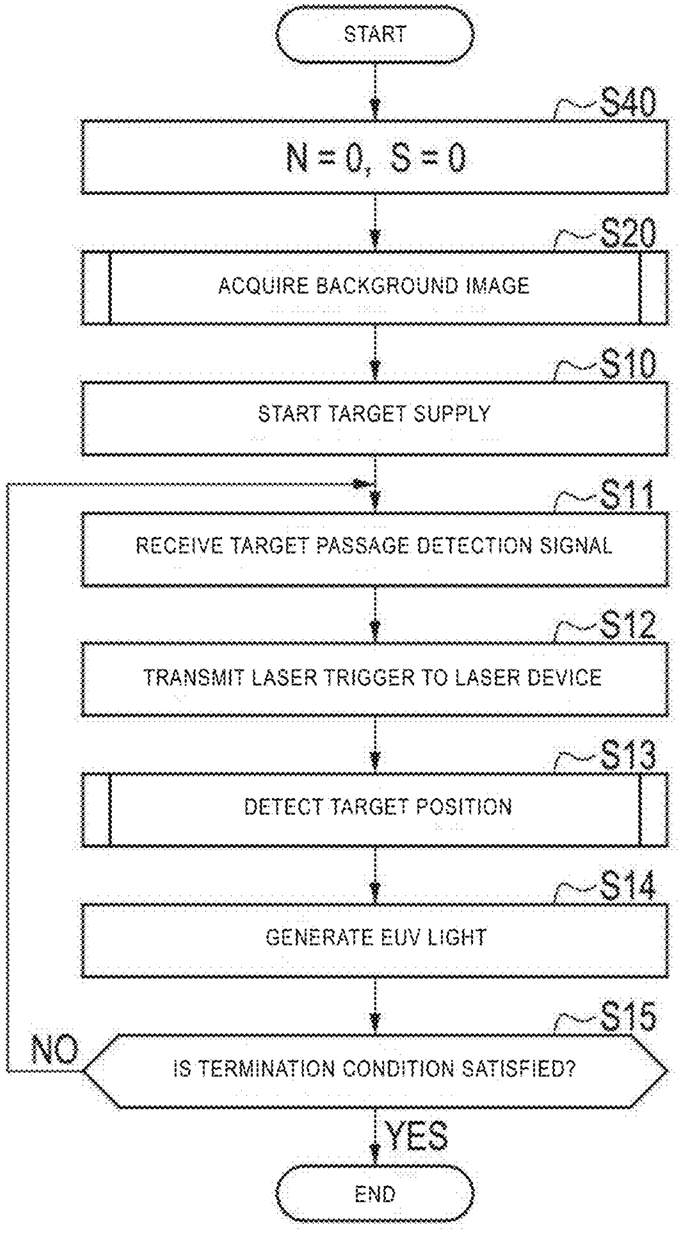
FIG. 20 is a flowchart showing the entire flow of the operation of the EUV light generation apparatus according to a third modification.

FIG. 20 shows the entire flow of the operation of the EUV light generation apparatus 12 according to the third modification. In the present modification, prior to step S20, a process of setting parameters (step S40) is added, and the contents of the process of acquiring the background image B0 (step S20) and the process of detecting the target position (step S13) are different from those in the second embodiment.

The processor 110 sets parameters N, S to "0", respectively, prior to causing the target supply device 18 to start supplying the target 27 into the chamber 16 (step S40). Here, N is a parameter for counting the number of acquired images. Further, S is a parameter for distinguishing whether the image acquired immediately before is the first target image T1 or the second target image T2.

Figure 21:
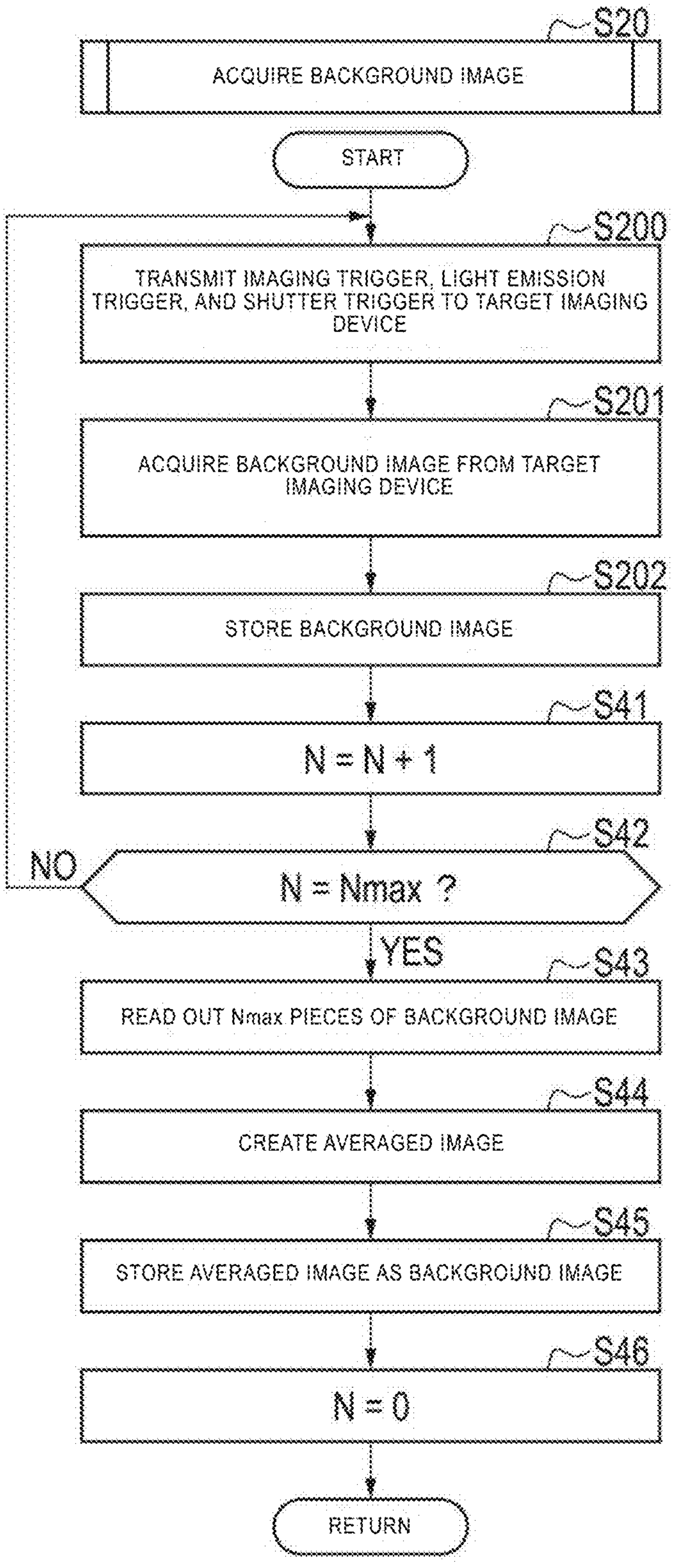
FIG. 21 is a flowchart showing details of the process of acquiring the background image according to the third modification.

FIG. 21 shows details of the process of acquiring the background image B0 according to the third modification (step S20). In the present modification, steps S41 to S46 are added after step S202. Steps S200 to S202 are similar to the processes described in the first embodiment, and the processor 110 acquires and stores the background image B0.

After step S202, the processor 110 adds "1" to the parameter N (step S41), and determines whether or not the parameter N is equal to a maximum value Nmax (step S42). For example, the maximum value Nmax is "5." When the parameter N is not equal to the maximum value Nmax (step S20: NO), the processor 110 returns processing to step S200. When the parameter N is equal to the maximum value Nmax (step S20: YES), the processor 110 shifts processing to step S43. Thus, the processor 110 stores Nmax pieces of the background images B0 by repeating steps S200 to S202 for Nmax times.

In step S43, the processor 110 reads out Nmax pieces of the background images B0. Then, the processor 110 creates an averaged image obtained by averaging the Nmax pieces of the read-out background images B0 (step S44), and stores the created averaged image as the background image B0 (step S45). Thereafter, the processor 110 sets the parameter N to "0" (step S46), and ends processing.

Figure 22:
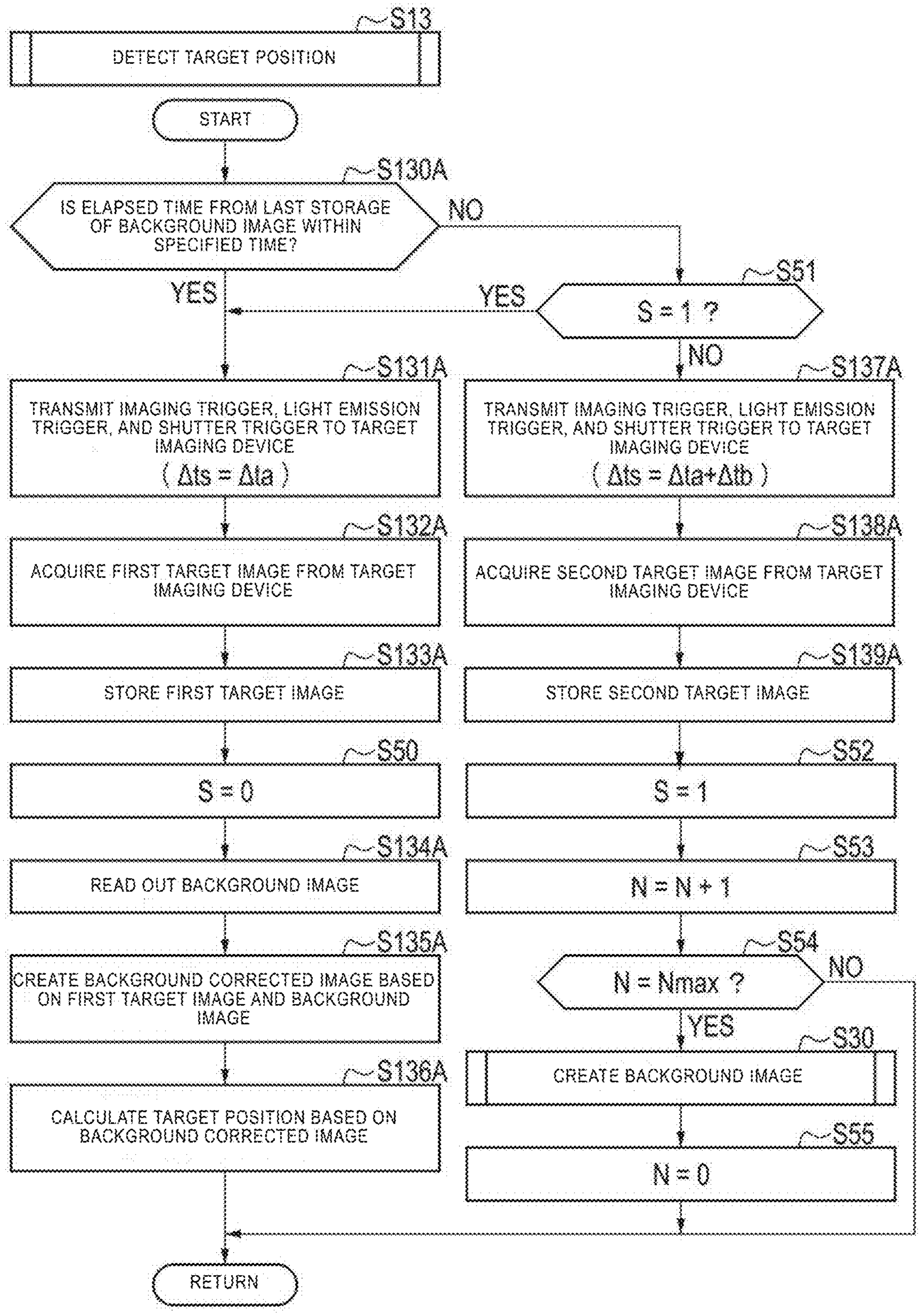
FIG. 22 is a flowchart showing details of the process of detecting the target position according to the third modification.

FIG. 22 shows details of the process of detecting the target position according to the third modification (step S13). In the present modification, steps S50 to S55 are added to the process of detecting the target position according to the second embodiment.

In the present modification, when the elapsed time since the last storage of the background image B0 is within a specified time (step S130A: YES), the processor 110 acquires and stores the first target image T1 by executing steps S131A to S133A, and then sets the parameter S to "0" (step S50). Here, S=0 indicates that the acquired image is the first target image T1. The subsequent steps S134A to S136A are similar to those in the second embodiment.

When the elapsed time since the last storage of the background image B0 is not within the specified time (step S130A: NO), the processor 110 determines whether or not the parameter Sis "1" (step S51). When the parameter S is not "1" (step S51: NO), the processor 110 acquires and stores the second target image T2 by executing steps S137A to S139A, and then sets the parameter S to "1" (step S52). Here, S=2 indicates that the acquired image is the second target image T2.

Thereafter, the processor 110 adds "1" to the parameter N (step S53), and determines whether or not the parameter N is equal to the maximum value Nmax (step S54). When the parameter N is not equal to the maximum value Nmax (step S54: NO), the processor 110 ends processing. On the other hand, when the parameter N is equal to the maximum value Nmax (step S54: YES), the processor 110 executes the process of creating the background image B0 (step S30), then sets the parameter N to "0" (step S55), and ends processing.

According to the above-described processing, when it is determined that the elapsed time since the last storage of the background image B0 is not within the specified time, the first target image T1 and the second target image T2 are alternately acquired. As a result, at the time point when the parameter N is determined to be equal to the maximum value Nmax, Nmax pieces of the first target images T1 and Nmax pieces of the second target images T2 are stored. Here, the maximum value Nmax is not limited to 5. The maximum value Nmax is preferably in a range of 5 to 20 both inclusive.

Figure 23:
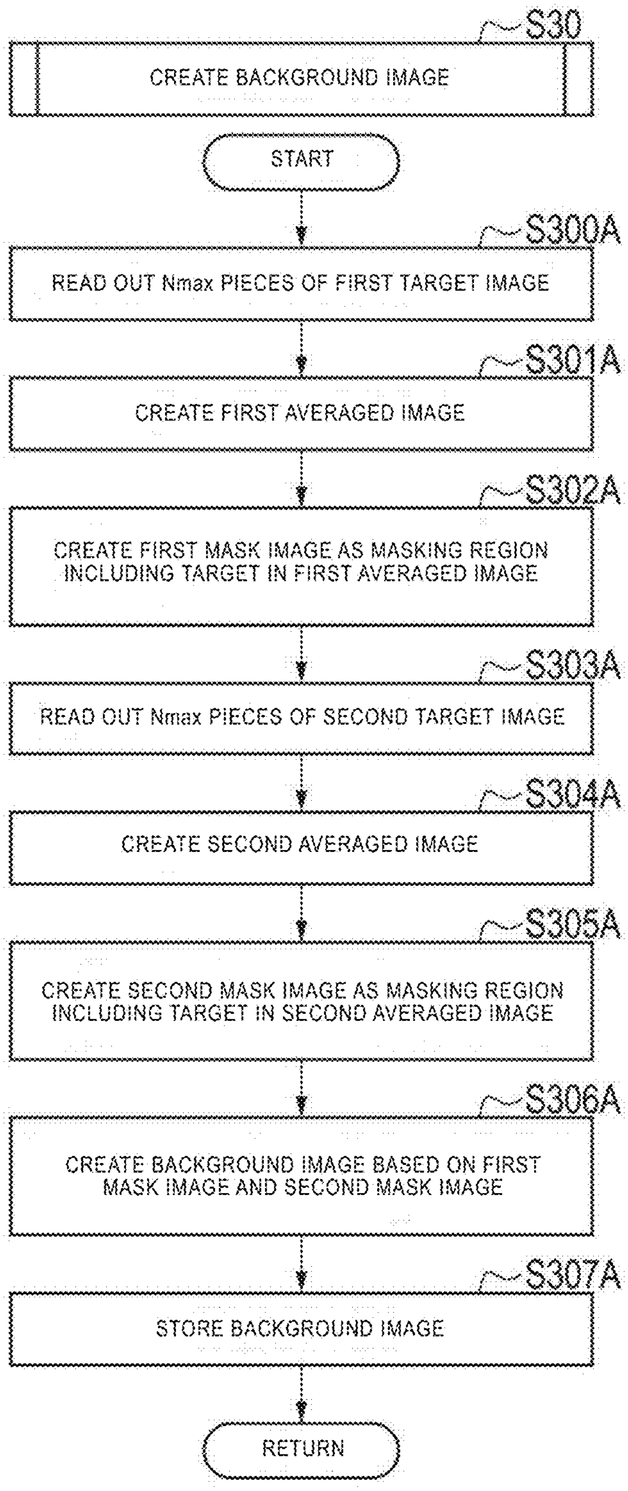
FIG. 23 is a flowchart showing details of the process of creating the background image according to a second modification.

FIG. 23 shows details of the process of creating the background image B0 according to the third modification (step S30). In the present modification, the processor 110 reads out the Nmax pieces of the first target images T1 (step S300A), and creates a first averaged image obtained by averaging the Nmax pieces of the read-out first target images T1 (step S301A). Then, the processor 110 creates the first mask image M1 in which the region including the target 27 in the first averaged image is masked (step S302A).

Further, the processor 110 reads out the Nmax pieces of the second target images T2 (step S303A), and creates a second averaged image obtained by averaging the Nmax pieces of the read-out second target images T2 (step S304A). Then, the processor 110 creates the second mask image M2 in which the region including the target 27 in the second averaged image is masked (step S305A).

Next, the processor 110 creates the background image B0 based on the first mask image M1 and the second mask image M2 (step S306A), and stores the created background image B0 (step S307A). The process of creating the background image B0 based on the first mask image M1 and the second mask image M2 is similar to that of the second embodiment.

In the present modification, since the plurality of first target images T1 and the plurality of second target images T2 are acquired to create the background image B0, the influence of temporal variation in the luminance of the background image B0 can be reduced.

Further, if the plurality of second target images T2 are continuously acquired, a period in which the position of the target 27 cannot be detected becomes long. However, in the present modification, since the first target image T1 and the second target image T2 are alternately acquired, it is possible to shorten a period in which the position of the target 27 cannot be detected.

Here, each of the first to third modifications may be individually applied to the second embodiment, or a combination of two or more of the first to third modifications may be applied to the second embodiment.

In each of the above-described embodiments, the external apparatus 46 is an exposure apparatus, but the external apparatus 46 may be an inspection apparatus for inspecting a mask on which a device pattern to be transferred to a semiconductor wafer is formed. In this case, the EUV light concentrating mirror 24 may be a grazing incidence type.

5. Others

Figure 24:
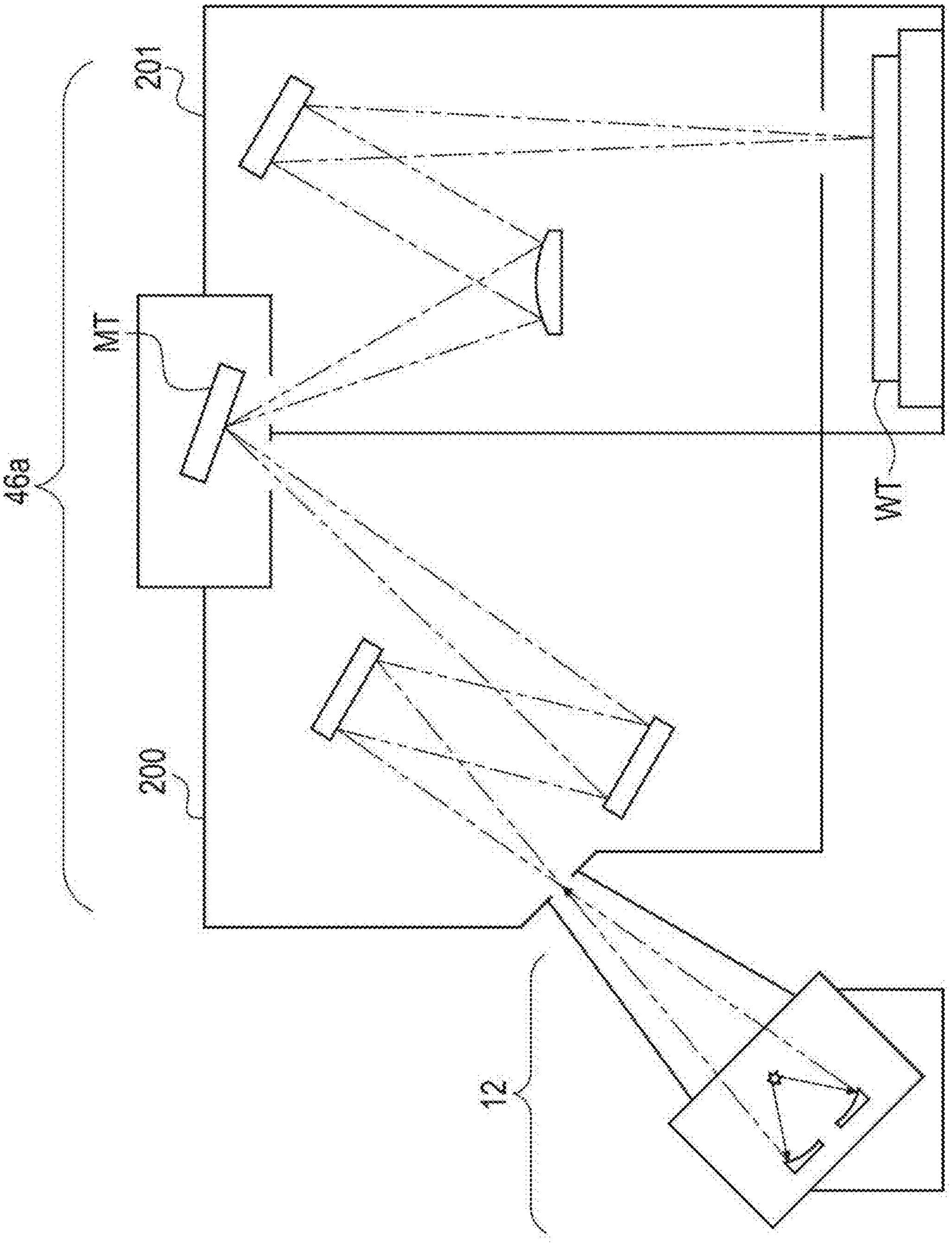
FIG. 24 is a diagram schematically showing the configuration of an exposure apparatus connected to the EUV light generation apparatus.

FIG. 24 schematically shows the configuration of an exposure apparatus 46*a* connected to the EUV light generation apparatus 12. In FIG. 24, the exposure apparatus 46*a* as the external apparatus 46 includes a mask irradiation unit 200 and a workpiece irradiation unit 201. The mask irradiation unit 200 irradiates, via a reflection optical system, a mask pattern on a mask table MT with the EUV light incident from the EUV light generation apparatus 12. The workpiece irradiation unit 201 images the EUV light reflected by the mask table MT onto a workpiece (not shown) arranged on a workpiece table WT via a reflection optical system. The workpiece is a photosensitive substrate such as a semiconductor wafer on which photoresist is applied. The exposure apparatus 46*a* synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 25:
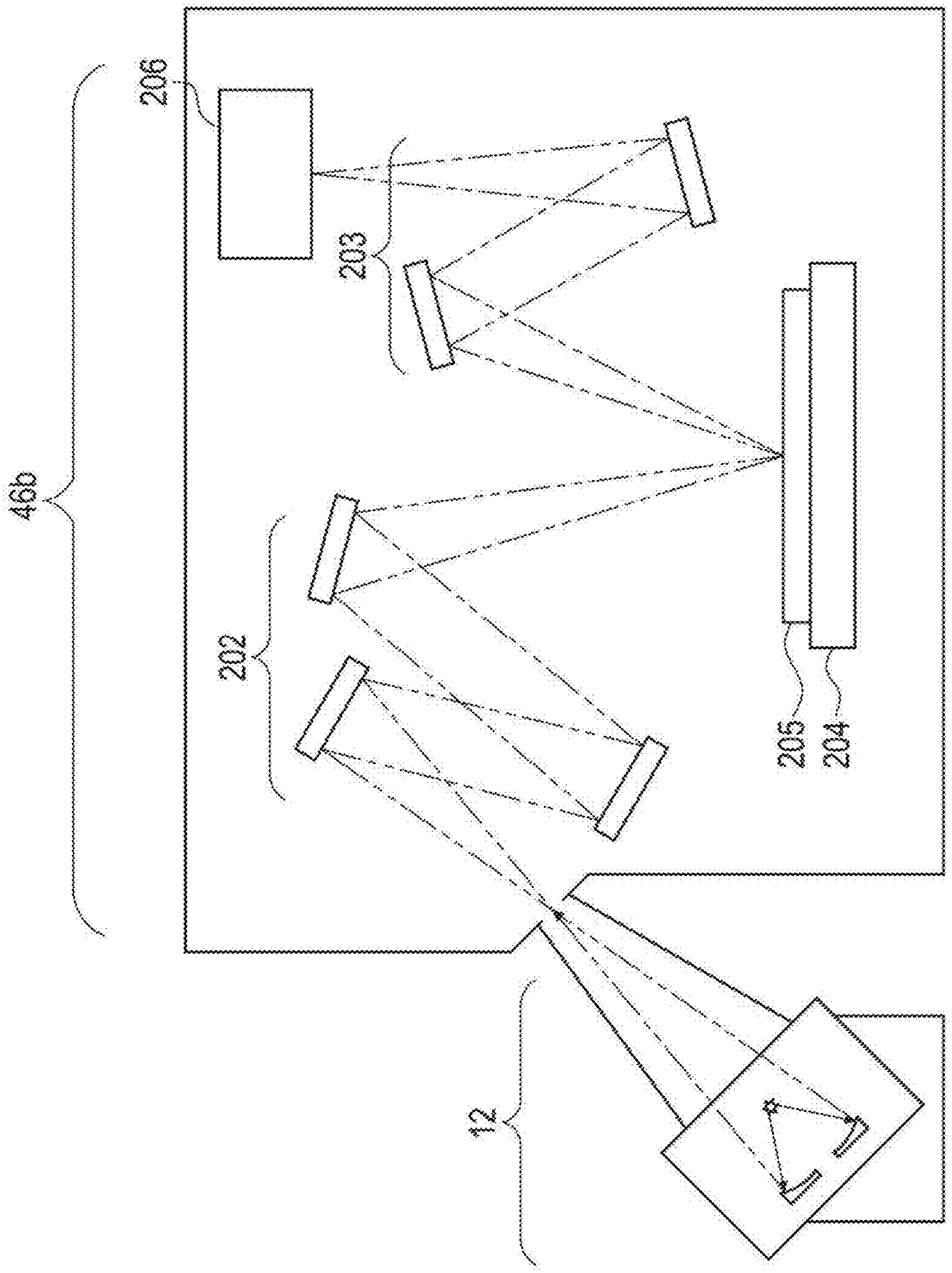
FIG. 25 is a diagram schematically showing the configuration of an inspection apparatus connected to the EUV light generation apparatus.

FIG. 25 schematically shows the configuration of an inspection apparatus 46*b* connected to the EUV light generation apparatus 12. In FIG. 25, the inspection apparatus 46*b* as the external apparatus 46 includes an illumination optical system 202 and a detection optical system 203. The EUV light generation apparatus 12 outputs, as a light source for inspection, EUV light to the inspection apparatus 46*b*. The illumination optical system 202 reflects the EUV light incident from the EUV light generation apparatus 12 to illuminate a mask 205 placed on a mask stage 204. Here, the mask 205 conceptually includes a mask blanks before a pattern is formed. The detection optical system 203 reflects the EUV light from the illuminated mask 205 and forms an image on a light receiving surface of a detector 206. The detector 206 having received the EUV light acquires an image of the mask 205. The detector 206 is, for example, a time delay integration (TDI) camera. A defect of the mask 205 is inspected based on the image of the mask 205 acquired by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 46*a*.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An EUV light generation apparatus, comprising:
- a chamber;
- a target supply device configured to supply a target into the chamber;
- a target imaging device configured to create a first target image by imaging an imaging region including the target and a second target image by imaging the imaging region at a timing at which a second target-image region including an image of the target in the second target image does not overlap with any portion of a first target-image region including an image of the target in the first target image, wherein the target imaging device comprises a single image sensor configured to create both the first target image and the second target image; and
- a processor configured to store the second target image as a background image, create a background corrected image by subtracting the background image from the first target image, and detect a position of the target based on the background corrected image.

2. The EUV light generation apparatus according to claim 1,
- wherein the processor acquires the background image at every specified time.

3. The EUV light generation apparatus according to claim 2,
- wherein the specified time is in a range of 1 to 24 hours both inclusive.

4. An EUV light generation apparatus comprising:
- a chamber;
- a target supply device configured to supply a target into the chamber;
- a target imaging device configured to create a first target image by imaging an imaging region including the target, and to create a second target image by imaging the imaging region at a timing at which a second target-image region including an image of the target in the second target image does not overlap with any portion of a first target-image region including an image of the target in the first target image, wherein the target imaging device comprises a single image sensor configured to create both the first target image and the second target image; and
- a processor configured to generate a first mask image by masking the first target-image region including the image of the target in the first target image, generate a second mask image by masking the second target-image region including the image of the target in the second target image, create a background image by combining the first mask image and the second mask image, create a background corrected image by subtracting the background image from the first target image, and detect a position of the target based on the background corrected image.

5. The EUV light generation apparatus according to claim 4,
- wherein the first target-image region and the second target-image region are each rectangular or circular.

6. The EUV light generation apparatus according to claim 4,
- wherein the processor corrects luminance of at least one of the first target image and the second target image before creating the first mask image and the second mask image.

7. The EUV light generation apparatus according to claim 6,
- wherein the processor corrects the luminance of at least one of the first target image and the second target image so that an average luminance value of the first target image excluding the first target-image region and an average luminance value of the second target image excluding the second target-image region coincide with each other.

8. The EUV light generation apparatus according to claim 4,
- wherein the processor performs a blurring process on the background corrected image and detects the position of the target based on the blurred background corrected image.

9. The EUV light generation apparatus according to claim 8,
- wherein the blurring process is a filtering process using an averaging filter or a Gaussian filter.

10. The EUV light generation apparatus according to claim 8,
- wherein the processor detects the position of the target based on a binarized image created by performing a binarization process on the blurred background corrected image.

11. The EUV light generation apparatus according to claim 4,
- wherein the processor creates the background image based on a plurality of the first target images and a plurality of the second target images.

12. The EUV light generation apparatus according to claim 11,
- wherein the processor acquires the first target image and the second target image alternately.

13. The EUV light generation apparatus according to claim 11,
- wherein a number of the first target images and a number of the second target images to be used for creating the background image are each in a range of 5 to 20 both inclusive.

14. The EUV light generation apparatus according to claim 11,
- wherein the processor creates the background image based on a first averaged image obtained by averaging the plurality of first target images and a second averaged image obtained by averaging the plurality of second target images.

15. The EUV light generation apparatus according to claim 14, wherein the background image is created based on a first mask image created as masking a first target-image region including the target in the first averaged image and a second mask image created as masking a second target-image region including the target in the second averaged image.

16. The EUV light generation apparatus according to claim 1, wherein a timing of acquiring the first target image and a timing of acquiring the second target image are shifted from each other by 1/(2f) where f represents an output frequency of the target output from the target supply device.

17. An electronic device manufacturing method, comprising:

inspecting a defect of a mask by irradiating the mask with EUV light generated by an EUV light generation apparatus;

selecting a mask using a result of the inspection; and exposing and transferring a pattern formed on the selected mask onto a photosensitive substrate, the EUV light generation apparatus including:

a chamber;

a target supply device configured to supply a target into the chamber;

a target imaging device configured to create a first target image by imaging an imaging region including the target and a second target image by imaging the imaging region at a timing at which a second target-image region including an image of the target in the second target image does not overlap with any portion of a first target-image region including an image of the target in the first target image, wherein the target imaging device comprises a single image sensor configured to create both the first target image and the second target image; and a processor configured to store the second target image as a background image, create a background corrected image by subtracting the background image from the first target image, and detect a position of the target based on the background corrected image.

18. The EUV light generation apparatus according to claim 1, wherein the processor detects the position of the target by detecting a black region in the background corrected image.

* * * * *